United States Patent [19]

Yagi et al.

[11] Patent Number: 4,610,280
[45] Date of Patent: Sep. 9, 1986

[54] METHOD OF AND APPARATUS FOR SUPPLYING AND TRANSFERRING ELECTRONIC COMPONENTS

[75] Inventors: Hiroshi Yagi; Yoshio Harada, both of Tokyo, Japan

[73] Assignee: TDK Corporation, Japan

[21] Appl. No.: 553,681

[22] Filed: Nov. 21, 1983

[30] Foreign Application Priority Data

Nov. 24, 1982 [JP] Japan ................................ 57-204622
Dec. 16, 1982 [JP] Japan ........................... 57-190426[U]
Feb. 21, 1983 [JP] Japan ............................ 58-23049[U]
Mar. 10, 1983 [JP] Japan ............................ 58-33563[U]
Apr. 11, 1983 [JP] Japan ............................ 58-52745[U]

[51] Int. Cl.⁴ ........................ H05K 3/32; H05K 13/02
[52] U.S. Cl. .................... 140/105; 29/564.6; 29/741; 198/378
[58] Field of Search ............... 29/564.6, 564.1, 33 M, 29/564.7, 564.8, 566.2, 566.3, 563, 741, 759, 835–839; 140/140, 105; 198/375, 377, 378; 417/223

[56] References Cited

U.S. PATENT DOCUMENTS

| | | | |
|---|---|---|---|
| 4,051,593 | 10/1977 | Mori et al. | 29/564.6 |
| 4,244,101 | 1/1981 | Talley | 29/759 |
| 4,263,708 | 4/1981 | Takahashi et al. | 29/564.6 |
| 4,293,999 | 10/1981 | Woodman | 29/564.6 |
| 4,344,219 | 8/1982 | Tanabe et al. | 29/564.6 |
| 4,403,723 | 9/1983 | Dean et al. | 29/564.6 |

Primary Examiner—Francis S. Husar
Assistant Examiner—Jerry Kearns
Attorney, Agent, or Firm—Steinberg & Raskin

[57] ABSTRACT

Apparatus for supplying and transferring electronic components includes a plurality of pallets each for receiving and holding one electronic component. An endless conveying mechanism conveys the pallets in an intermittent fashion in a substantially horizontal plane. A supply unit mechanism selectively supplies electronic components to the pallets.

15 Claims, 38 Drawing Figures

FIG. 5
FIG. 8
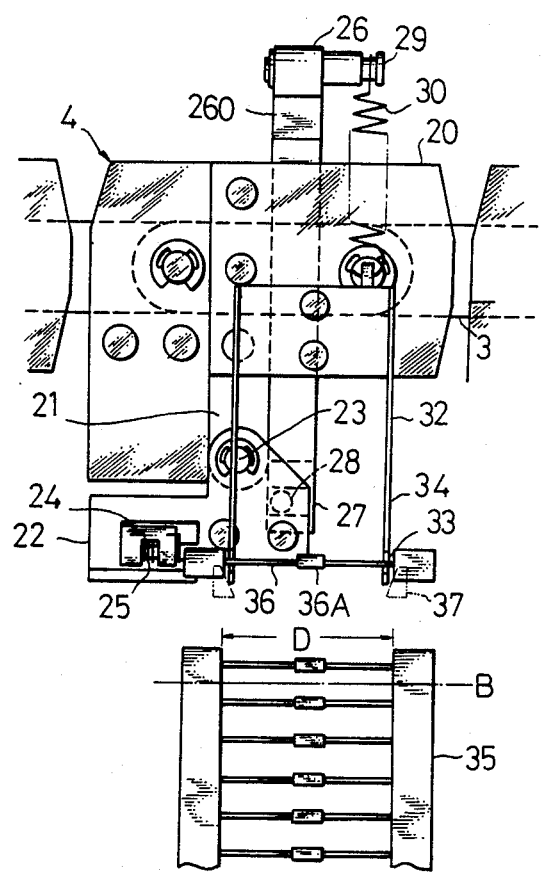
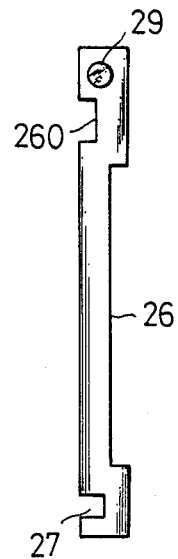
FIG. 9
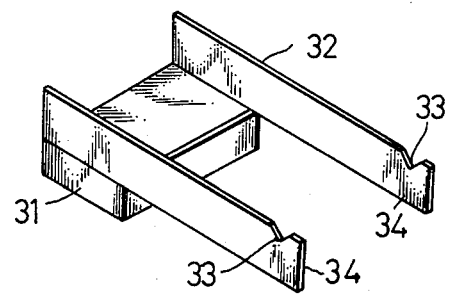

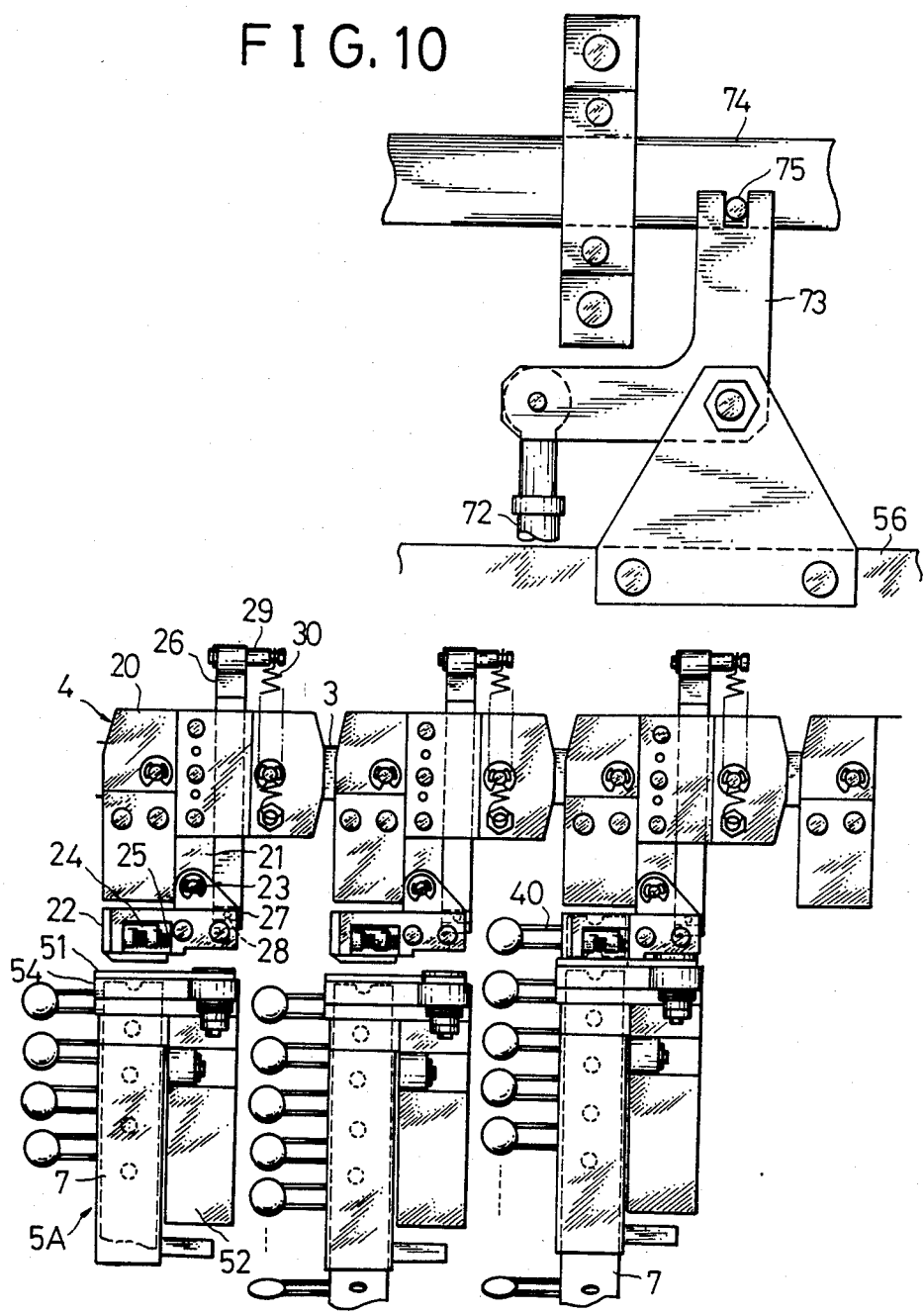

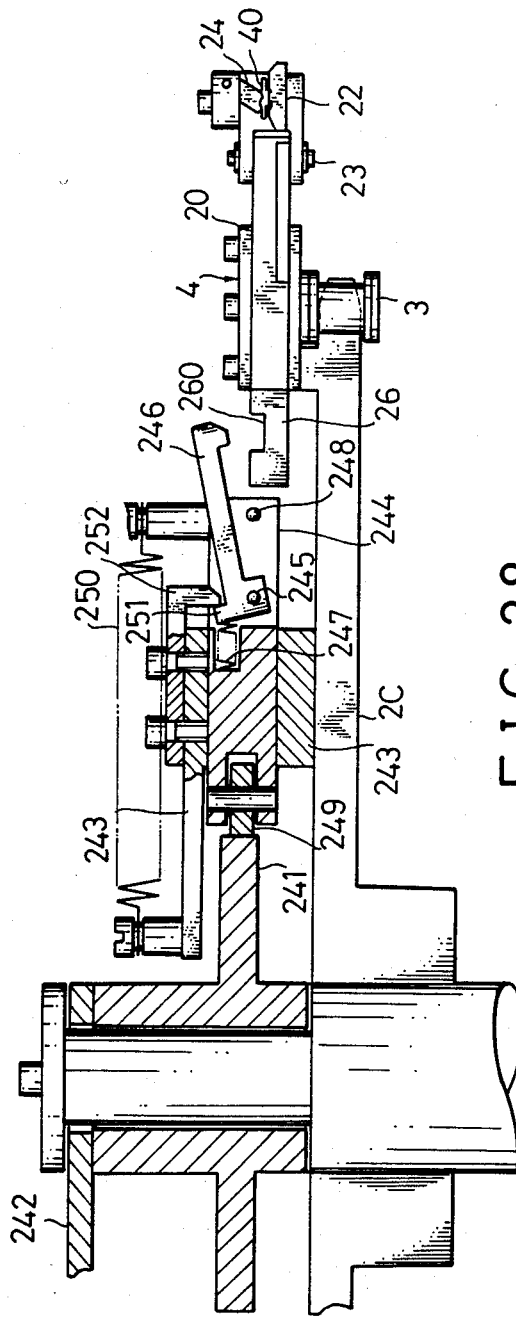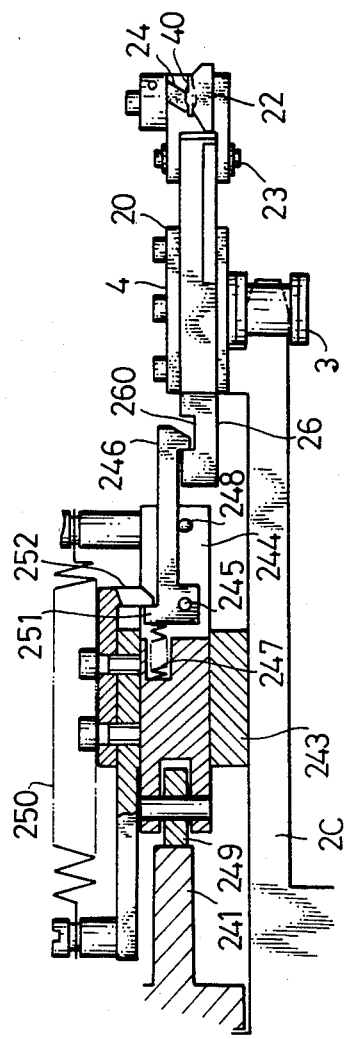

METHOD OF AND APPARATUS FOR SUPPLYING AND TRANSFERRING ELECTRONIC COMPONENTS

BACKGROUND OF THE INVENTION

The present invention relates to method of and apparatus for supplying and transferring electronic components. More particularly, the invention relates to a method and apparatus for supplying and transferring electronic components in an automatic inserting machine by which electronic components having leads are inserted into receiving openings of a printed circuit board. Separated pieces of electronic component web carriers obtained by cutting and separating those which are selected as required from a plurality of electronic component web carriers and each having one electronic component, hereinafter referred to as "separated piece", are received and held by pallets and transferred to an inserting assembly in a subsequent process. A chuck may be utilized, for example, for gripping the electronic component.

A prior art method and apparatus of this type are disclosed in U.S. Pat. No. 4,263,708. In the automatic inserting machine disclosed in this prior art patent, separated pieces cut and separated from those which are selected as required from a plurality of electronic component web carriers are held by bridge members extending up-and-down and then transferred to a chuck located at the lower position. In this machine, an increase in kinds of electronic component web carriers to be used causes an increase in the number of vertically extending bridge members. This results in an increased height of the apparatus and requires a room with a high ceiling for installation of such apparatus. In addition, the position at which the electronic components web carriers are connected to the apparatus before actuation of the machine must be as high, since it affects operability of the apparatus.

SUMMARY OF THE INVENTION

In order to solve these problems, the method and apparatus of the present invention conveys pallets holding separated pieces by means of an endless conveying mechanism such as a chain in a substantially horizontal plane. In this case, even if the kinds of electronic component web carriers are increased, the apparatus is enlarged in the horizontal direction only and kept at a fixed height. This permits the use of a room with a ceiling of an ordinary height for the installation of the apparatus.

The principal object of the invention is to provide a method and apparatus for supplying and transferring electronic components in which separated pieces of an electronic component web carrier may be transferred to a chuck by pallets while being kept at a fixed attitude, thereby enabling easy gripping thereof by the chuck and eliminating any operation such as twisting of the electronic component web carrier at the time of supply thereof to the pallet.

An object of the invention is to provide a method and apparatus for supplying and transferring electronic components in which mounting of the electronic component web carrier on the apparatus prior to driving of such apparatus is easy, with resultant high operability of the apparatus.

Another object of the invention is to provide a method and apparatus for supplying and transferring electronic components in which an endless conveying mechanism comprising sprocket wheels and chain travels in a substantially horizontal plane, even when there are various types of electronic component web carriers, so that the height of the apparatus may be fixed within a certain range and such apparatus may be installed in a room having a low ceiling.

Still another object of the invention is to provide a method and apparatus for supplying and transferring electronic components in which packages, each rotatably containing a reel having an electronic component web carrier wound thereon may be arranged at intervals equal to those between the pallets as well as between the supply units, so that a length of the electronic component web carrier to be drawn from the package may be a fixed constant, whereby mounting and replacement of packages may be made easy.

Yet another object of the invention is to provide a method and apparatus for supplying and transferring electronic components in which the transferring of separated pieces by pallets, the transferable positioning of the supply unit between a first position at which the separated piece may be supplied to the pallet and a second predetermined position, and the operation of a cutter of the supply unit only when the supply unit is in the first position, result in the prevention of useless operation of the cutter, such as missing the object to be cut, and the resultant ease of maintenance thereby enhancing the reliability of the apparatus.

Another object of the invention is to provide a method and apparatus for supplying and transferring electronic components in which the pallet is composed of a pallet base, a component receiving jig affixed to the pallet base and designed to receive a coaxial lead type electronic component or a separated piece of coaxial lead type electronic component web carrier, and a component holding device turnable with respect to the pallet base and holding the separated radial piece, so that the supply of the electronic component or the separated piece of electronic component web carrier is easy, it is possible to transfer the electronic component in a manner which maintains the electronic component in an attitude for easy gripping by the chuck, and to provide a conveying pallet usable for both coaxial lead type and radial lead type electronic components.

Still another object of the invention is to provide a method and apparatus for supplying and transferring electronic components in which the combination of a pallet capable of transferring the separated piece of radial lead type electronic component or coaxial lead type electronic component, a bending mechanism which re-forms a coaxial lead type electronic component into a radial lead type electronic component by bending the leads thereof and delivers the re-formed electronic component to the chuck and a changeover mechanism which changes over an operation for forming a radial lead type electronic component to another operation for forming a coaxial lead type electronic component, enables the insertion of a coaxial lead type electronic component via automatic electronic component insertion apparatus having a chuck for gripping a radial lead type electronic component, thereby improving the performance of the automatic insertion apparatus and effective utilization thereof.

Yet another object of the invention is to provide a method and apparatus for supplying and transferring electronic components in which the apparatus is of reduced height and electronic component web carriers are mounted on the apparatus with ease, thereby providing high operability.

The supply and transfer apparatus of the invention comprises a plurality of pallets, each for receiving and holding one electronic component. An endless conveying mechanism conveys the pallets in an intermittent fashion in a substantially horizontal plane. A supply unit selectively supplies electronic components to the pallets.

The method of the invention comprises selectively supplying electronic component web carriers each composed of electronic components having leads and arranged in a row, cutting the electronic component web carrier to form separated pieces of the electronic component web carrier, each having one electronic component, mounting the separated pieces on pallets at a first position, transferring the pallets on which the separated pieces are mounted to a second predetermined position, and delivering the separated piece having one electronic component, while holding the lead part thereof, to an inserting assembly at the second predetermined position.

BRIEF DESCRIPTION OF THE DRAWINGS

For a fuller understanding of the invention, reference is had to the following description, taken in connection with the accompanying drawings, in which:

FIG. 5 is a plan view of an embodiment of the pallet of the apparatus of the invention;

FIG. 8 is a side view of an embodiment of the slide bar of the pallet of the apparatus of the invention;

FIG. 9 is a perspective view of an embodiment of a jig of the pallet of the apparatus of the invention for receiving an electronic component;

FIG. 10 is a plan view of pallets and supply units of the apparatus of the invention for radial lead type electronic components;

FIG. 27 is a side view, partly in section, of an embodiment of a mechanism of the apparatus of the invention for turning the electronic component receiving part of the pallet;

FIG. 28 is a side view, partly in section, of the embodiment of the mechanism of FIG. 27;

DESCRIPTION OF PREFERRED EMBODIMENTS

Figure 1:
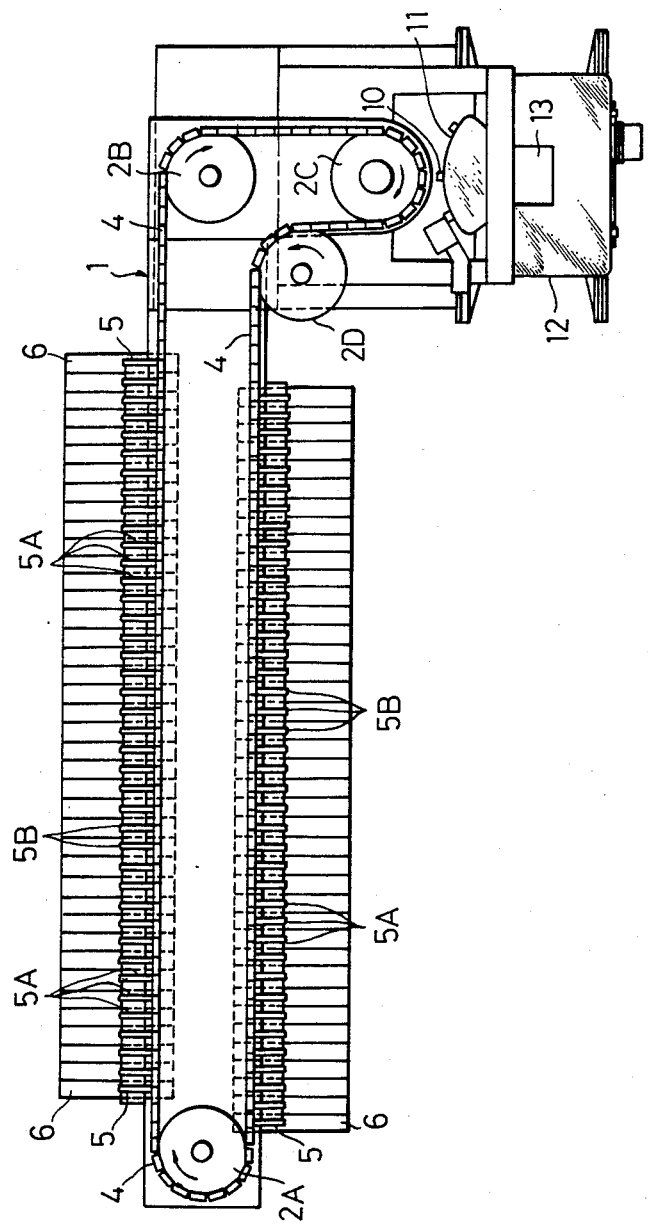
FIG. 1 is a plan view of an embodiment of the apparatus for supplying and transferring electronic components of the invention.
Figure 2:
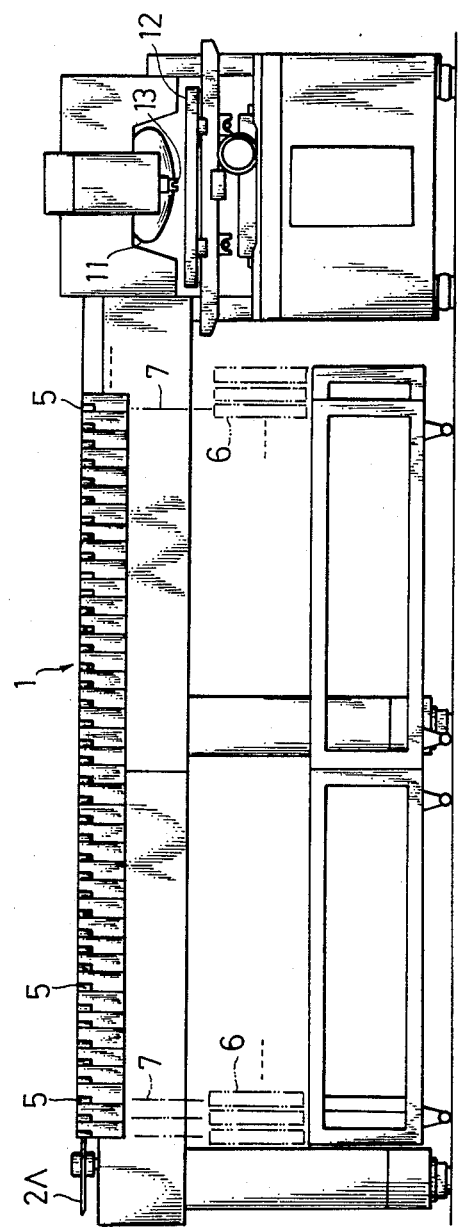
FIG. 2 is a front elevation of the embodiment of FIG. 1.
Figure 3:
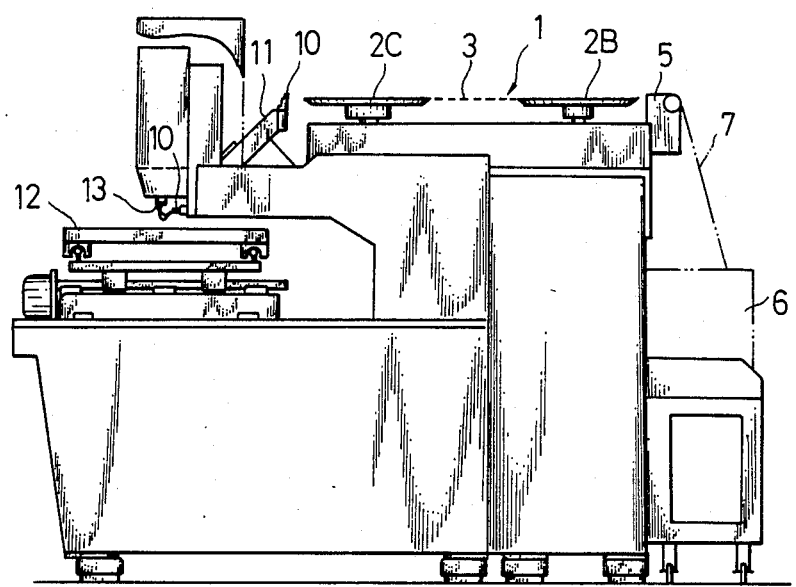
FIG. 3 is a side elevation of the embodiment of FIG. 1.

FIGS. 1 to 3 show the entire structure of the electronic component supply and transfer apparatus of the invention using pallets for transferring electronic components incorporated in an automatic inserting assembly. As shown in FIGS. 1 to 3, the electronic component supply and transfer apparatus 1 is provided with an endless conveying mechanism travelling in an intermittent fashion and composed of a chain 3 extended between sprockets 2A and 2D. Pallets 4 are affixed to the chain 3 at a constant pitch for transferring electronic components. The pallets 4 transfer both coaxial lead type electronic components and radial lead type electronic components. Each pallet 4 holds a separated piece of coaxial lead type electronic component web carrier, hereinafter referred to as a "separated coaxial piece", or a separated piece of radial lead type electronic component web carrier, hereinafter referred to as a "separated radial piece", obtained by cutting and separating a coaxial lead type electronic component web carrier or a radial lead type electronic component web carrier (as, for example, in U.S. Pat. No. 4,243,139), respectively, so that each separated piece possesses a piece of electronic component.

Supply units 5 are arranged at intervals equal to those for the pallets 4 along a straight path along which the chain 3 travels, that is, along which the pallets 4 also travel. An axial or radial lead type electronic component web carrier drawn from a package 6 (as, for example, in U.S. Pat. No. 4,165,807) rotatably containing a reel on which an electronic component web carrier is wound is connected to each supply unit 5. The packages 6 are arranged at intervals equal to those of the supply units 5. An axial lead type or radial lead type electronic component web carrier drawn from a package 6 is delivered to the supply unit 5 as it is, without twisting. The drawn lengths of electronic components are equal to each other throughout the group of packages 6.

In addition to the electronic component supply and transfer apparatus 1, the automatic inserting machine is provided with chucks 10, as disclosed in U.S. Pat. No. 4,054,988, for gripping radial type leads of a separated piece transferred by said apparatus. The automatic inserting machine is also provided with a disk 11 on which the chucks 10 are provided at equal intervals and inserting apparatus 13 for inserting leads of an electronic component transferred by a chuck 10 to a printed circuit board on an XY table 12.

The electronic component supply and transfer apparatus 1 is optionally provided with a bending mechanism which bends and re-forms leads of the separated coaxial piece transferred by the pallets 4 into radial type leads and transfers these leads to the chuck 10. The electronic component supply and transfer apparatus 1 is also provided with a changeover mechanism for changing over the operation of the apparatus according to a case in which the pallet 4 holds the separated coaxial or radial piece.

As shown in FIGS. 4 to 9, the pallet 4 for transferring electronic components, and which is usable for both coaxial and radial lead type components, is affixed to the chain 3 at a pallet base 20. A component holding device 22 for holding a radial lead type electronic component is pivotally affixed via a pin 23 to a hinge part 21 projecting sideways from the pallet base 20. A holding finger 24 is provided for the component holding device 22 and is energized by a spring 25, so that it is contacted by the upper surface of said component holding device. A slide bar 26, having a configuration shown in FIG. 8, slidably passes through the pallet base 20 and a pin 28 projecting from the underside of the component holding device 22 is adapted to engage with a groove 27 on the front end of said slide bar. An expansion spring 30 is provided between a pin 29 at the rear end of the slide bar 26 and the pallet base 20, whereby said slide bar is maintained projecting frontward. Thus, the component holding device 22 is adapted to project frontward, that is, it is maintained in parallel with the pallet base 20.

When a radial lead type electronic component is to be supplied to the pallet 4, a radial lead type electronic component web carrier 7 is cut, as shown by the alternate long and short dash line A, so that each of cut pieces possesses one electronic component, and an operation is carried out at the radial piece supply unit 5A (shown in FIG. 1) to supply the separated radial piece 40 to the component holding device 22.

A component receiving jig 32 for receiving the coaxial lead type electronic component is affixed to the pallet base 20 through a base 31, as shown in FIG. 9. The component receiving jig 32 is provided with a pair of resilient arms 34, each having a V-shaped cutout 33 at the tip thereof for engagement with a lead.

When the coaxial lead type electronic component is to be supplied, a coaxial lead type electronic component web carrier 35 is cut, while in the state shown in FIG. 5, as shown by the alternate long and short dash line B. The result of the cutting is that each cut piece possesses one electronic component. An operation to supply the separated coaxial piece 36 to the component receiving jig 32 is carried out at the coaxial piece supply unit 5B, shown in FIG. 1. In this supply operation, tips of resilient arms 34 are correctly positioned by guides 37 on the side of the supply unit 5B, in order to correct mis-positioning caused by the driving of the pallets 4 by the chain.

The supply unit 5 includes, as hereinbefore described, the units 5A for supplying the radial lead type electronic component web carriers 7 and the other units 5B for the coaxial lead type electronic component web carriers 35. Both types of units are randomly arranged according to the type of electronic component to be inserted.

It is a matter of course that there may be another embodiment, different from the embodiment comprising supply units 5A and 5B, comprising only a supply unit, either 5A or 5B, to be used as a supplying and transferring apparatus for radial lead type electronic components or coaxial lead type electronic components, respectively.

Figure 11:
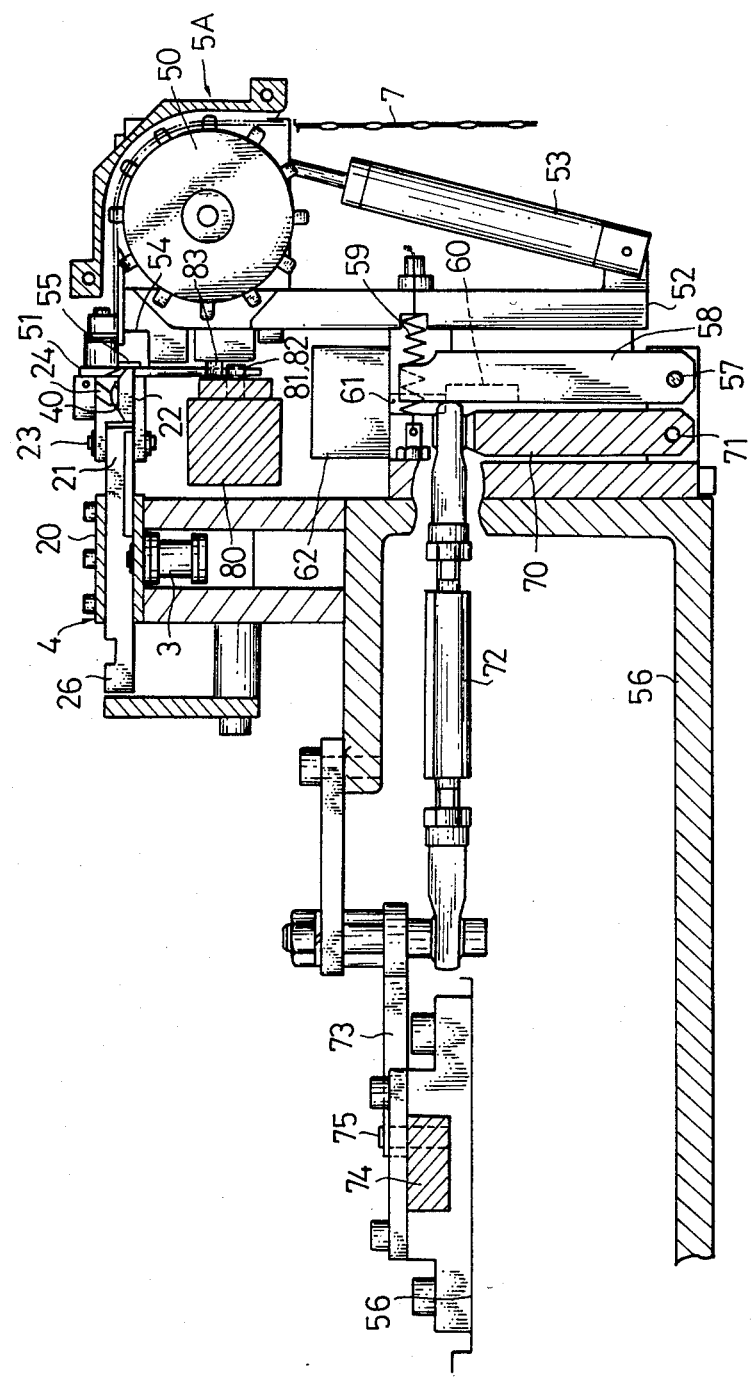
FIG. 11 is a side view, partly in section, of an embodiment of the supply unit of the apparatus of the invention for a radial lead type electronic component positioned in a first position at which the supply unit may supply the separated piece of electronic component web carrier to the pallet.
Figure 12:
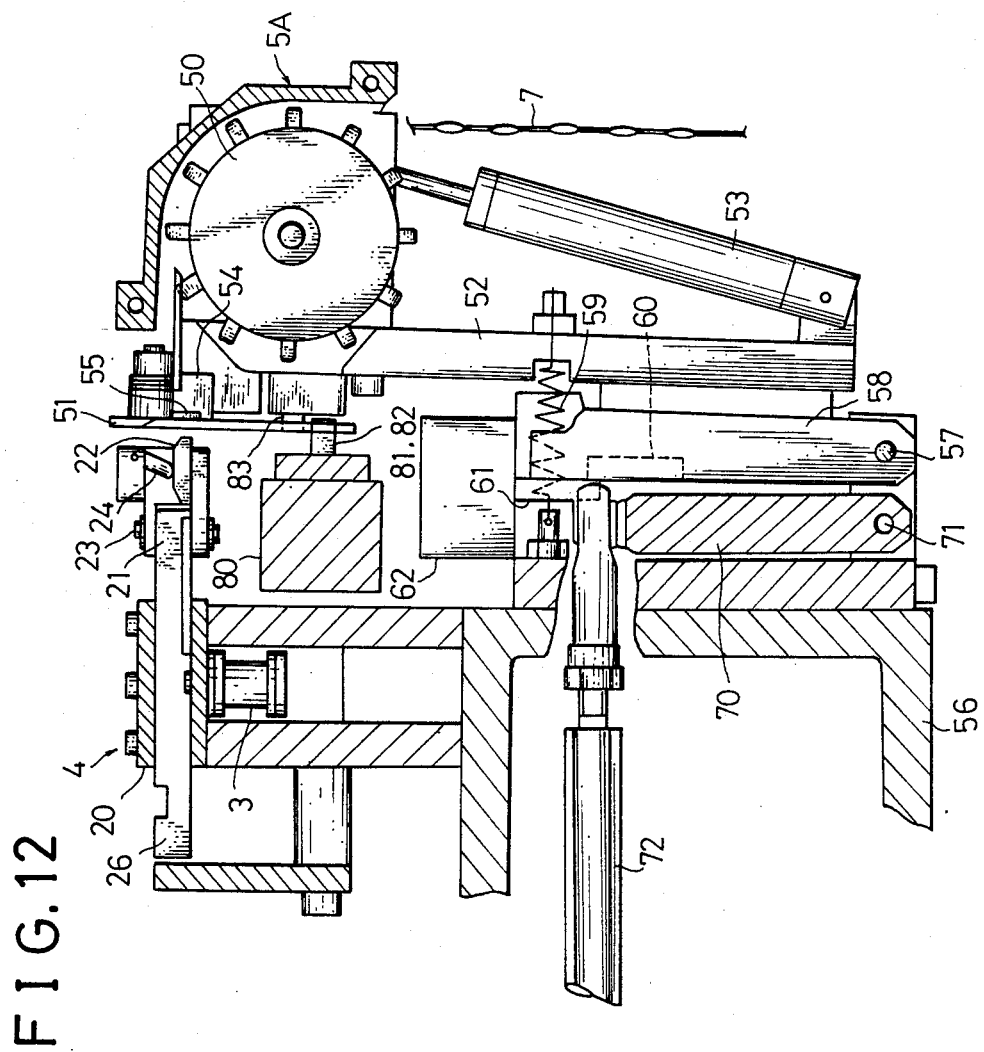
FIG. 12 is a side view, partly in section, of the embodiment of FIG. 11 of the supply unit positioned in a second predetermined position, deflected from the pallet.
Figure 13:
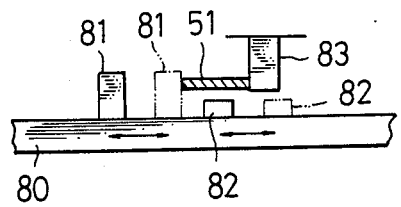
FIG. 13 is a plan view illustrating the action of a cutter of the apparatus of the invention.

The supply unit 5A, as shown in FIGS. 10 to 12, is provided with a pitch feeding wheel 50 for feeding the radial lead type electronic component web carrier 7 at a fixed rate of length in an intermittent fashion and a cutter 51 for cutting the radial lead type electronic component web carrier 7 into separated radial pieces 40. The pitch feeding wheel 50 is pivotally supported by a supply unit frame 52, equipped with a ratchet mechanism, and rotated at a predetermined rate corresponding to one expansive stroke of a cylinder 53. The cutter 51 is pivotally affixed to an end block 54 fixedly secured to the supply unit frame 52, in order to perform cutting in cooperation with a stationary cutter blade 55 affixed to the front surface of the end block 54. The height of the stationary cutter blade 55 is set to agree with the height of the component holding device 22 of the pallet 4. The supply unit frame 52 thus assembled, with the pitch feeding wheel 50 and the cutter 51, is integrally connected to a turning follower member 58 pivotally affixed to the apparatus frame 56 via a pin 57.

An expansion spring 59 is provided between the supply unit frame 52 and the apparatus frame 56, in order to energize the supply unit frame 52 in the direction along which said supply unit frame is adapted to be close and opposite to the pallet 4. Such direction is toward a first position shown in FIG. 11, at which the separated radial piece 40 may be supplied to the pallet 4. A contact block 60 is fixedly secured to the turning follower member 58 and a cylinder 62 having a shaft 61 capable of engaging the contact block 60 is fixedly provided on the side of the apparatus frame 56. The cylinder 62 is a single acting type, so that it contracts only when actuated, and the shaft 61 thereof is kept stretched when said cylinder 62 is not actuated and is adapted to engage the contact block 60 (FIG. 12) in order to place the supply unit 52 at a second position deflected from the pallet 4.

On the other hand, a plate-like turning driver member 70 is pivotally affixed to the apparatus frame 56 via a pin 71, in order to be close to all of the turning follower members 58 of the supply units 5A, in common. The turning driver member 70 is connected to one end of a lever 73 through a link 72. The other end of the lever 73 is engaged with a pin 75 provided upright on a slide shaft 74 slidable on the apparatus frame 56. Accordingly, the turning driver member 70 is turned with the sliding action of the slide shaft 74 and, during travelling of the pallet 4, tilts the turning follower member 58 of each supply unit 5A to the right side, as shown in FIG. 12, to put the supply unit 5A in a second predetermined position deflected from the pallet 4.

A cutter operating bar 80 acts on the cutters 51 of all the supply units 5A in common. A long pin 81 and a short pin 82 are affixed to the cutter operating bar 80, as shown in FIGS. 13 to 16, and a stopper pin 83 is fixedly provided on the side of the supply unit 5A.

Figure 17:
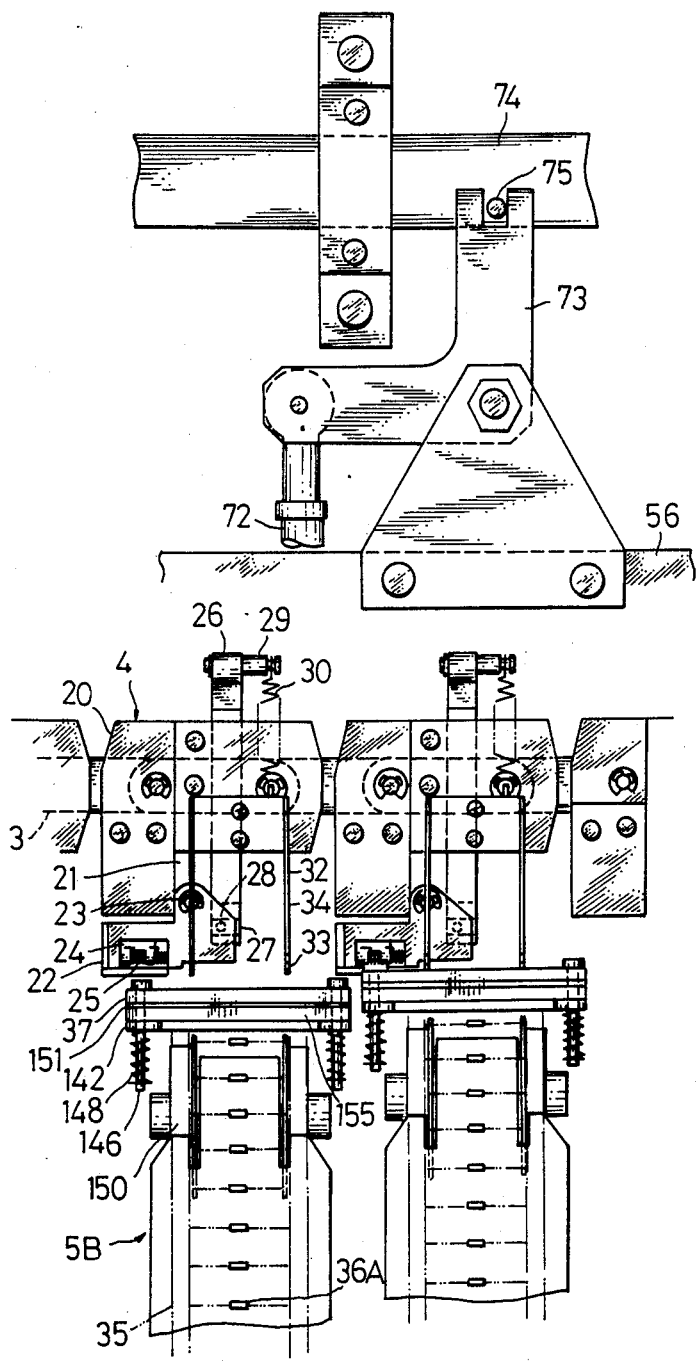
FIG. 17 is a plan view of pallets and supply units of the apparatus of the invention for coaxial lead type electronic components.

The supply unit 5B is provided with a pitch feeding wheel 150 (FIGS. 17 to 19) for feeding the coaxial lead type electronic component web carrier 35 at a fixed rate of length in an intermittent fashion. A cutter 151 cuts the coaxial lead type electronic component web carrier 35 into separated coaxial pieces 36. A guide 37 correctly positions the tips of the resilient arms 34 of the component receiving jig 32.

The pitch feeding wheel 150 is pivotally supported by a supply unit frame 152, equipped with a ratchet mechanism, and is driven by a cylinder 153 via a lever 138. The periphery of the pitch feeding wheel 150 has V-shaped cutouts 139 to engage with leads of the coaxial lead type electronic component web carrier 35. The pitch feeding wheel 150 is rotated at a predetermined rate corresponding to one expansive stroke of the cylinder 135 for feeding the coaxial lead type electronic component web carrier at a fixed rate of length to the component receiving jig 32.

Figure 20:
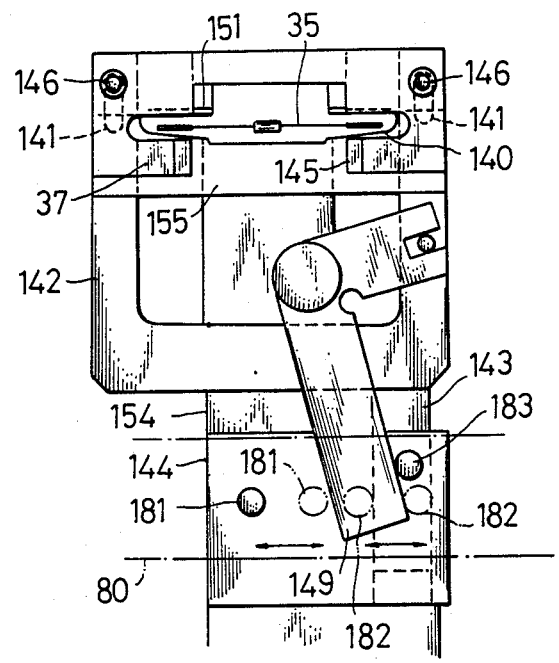
FIG. 20 is a front elevational view showing an embodiment of a cutter part of the apparatus of the invention in detail.
Figure 21:
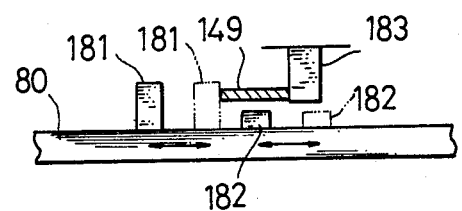
FIG. 21 is a plan view illustrating the action of the cutter of the apparatus of the invention.
Figure 25:
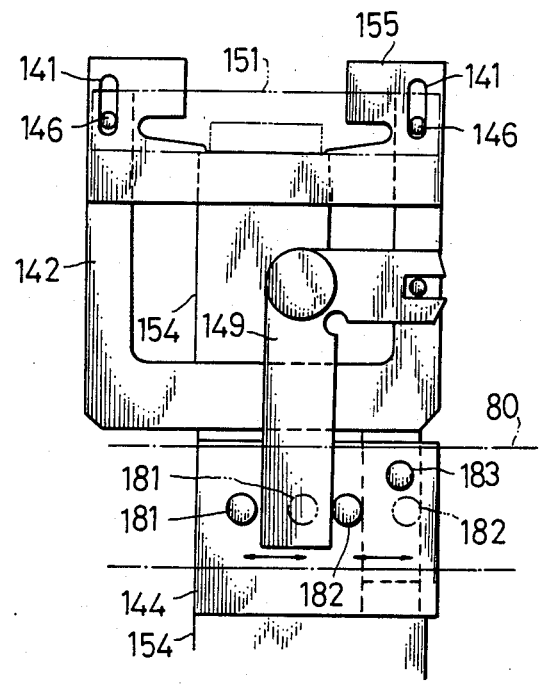
FIG. 25 is a front view of the cutter of FIG. 24.

A stationary cutter blade 155 is secured to a tip support plate 154 affixed to the supply unit frame 152, as shown in FIGS. 20 and 25. The cutter 151 is slidably provided in front of the stationary cutter blade. The stationary cutter blade 155 is provided with a groove 140 and a long hole 141 to permit the coaxial lead type electronic component web carrier 35 to pass therethrough. A U-shaped support member 142 is slidably mounted on the back of the stationary cutter blade 155. The U-shaped support member 142 is provided with a vertically extending part 143 stretching from the lower portion thereof and adapted to slide vertically through a block 144 affixed to the tip support plate 154.

A guide 37 is disposed in front of the cutter 151 and has a tapered surface 145 for contact with the tips of the resilient arms 34 of the component receiving jig 32 (FIG. 23) in order to correct positional deviation of said tips of said resilient arms caused when the pallets 4 are driven by the chain. The cutter 151 and the guide 37 are affixed to the stationary cutter blade 155 via bolts 146 passing through long holes 141 of the stationary cutter blade 155. The bolts 146 pierce the guide 37, cutter 151, stationary cutter blade 155, and U-shaped support member 142, in turn, to fasten these parts under a predetermined pressure with the aid of compression springs 148, each provided between a stop ring 147 and the U-shaped support member 142. As a result, the cutter 151 is connected to the U-shaped support member 142 via the bolts 146 and operates with the up-and-down movement of the U-shaped support member 142. A cutter lever 149 is pivotally affixed to the tip support plate 154 and connected to the U-shaped support member 142 at the top end thereof.

Figure 18:
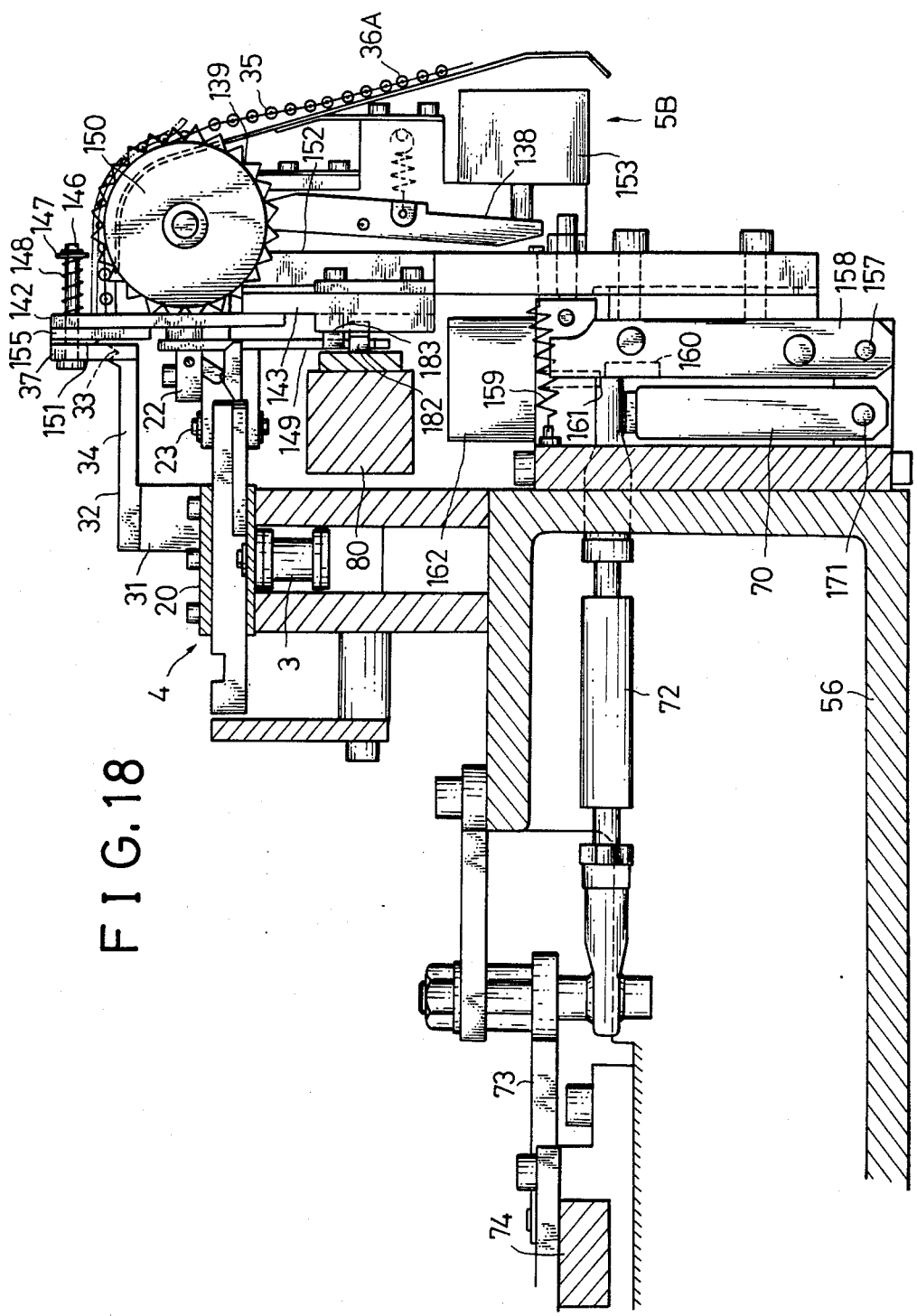
FIG. 18 is a side view, partly in section, of another embodiment of the supply unit of the apparatus of the invention positioned in a first position at which the supply unit may supply the separated piece of electronic component web carrier to the pallet.
Figure 19:
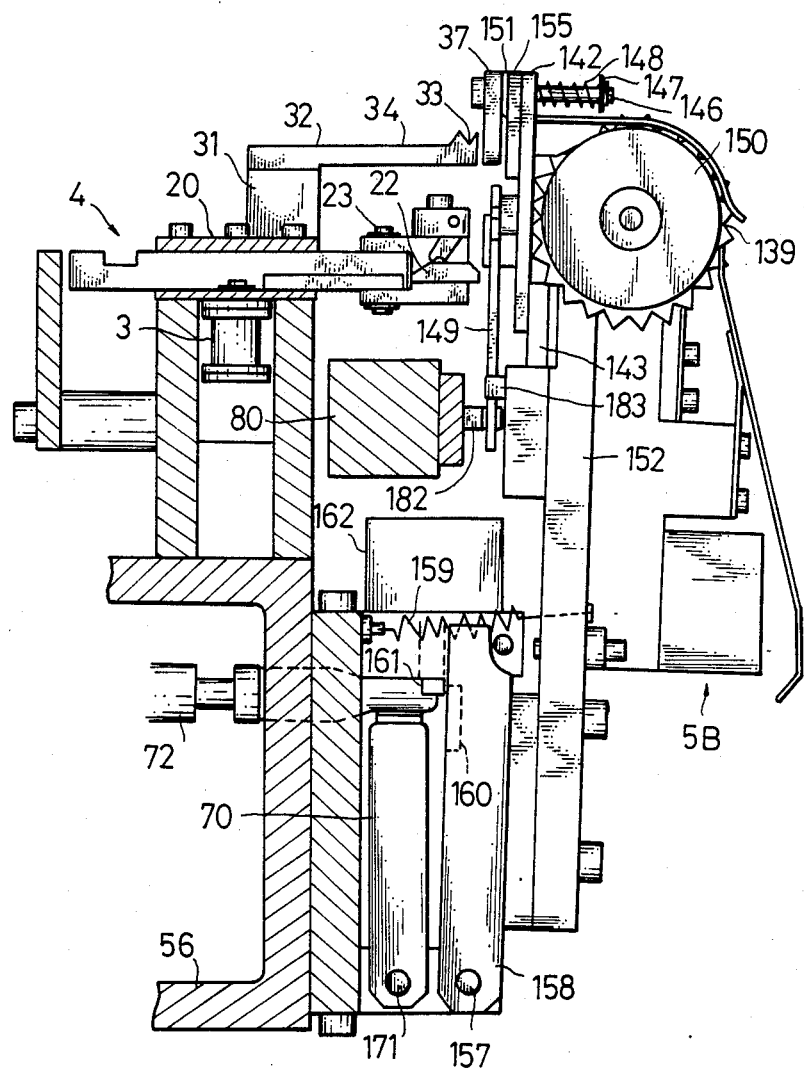
FIG. 19 is a side view, partly in section, of the embodiment of FIG. 18 of the supply unit positioned in a second position, deflected from the pallet.

The supply unit frame 152, thus composed of an assembly of the pitch feeding wheel 150 and the cutter 151, is integrally connected to the turning follower member 158 pivotally affixed to the apparatus frame 56 via a pin 157. An expansion spring 159 is provided between the supply unit frame 152 and the apparatus frame 56 and energizes the supply unit frame 152 in the direction along which the supply unit frame 152 is adapted to be close and opposite to the pallet 4. Such direction is toward a first position, shown in FIG. 18, at which the coaxial lead type electronic component web carrier 36 may be supplied to the pallet 4. A contact block 160 is fixedly secured to the turning follower member 158 and a cylinder 162 having a shaft 161 capable of engaging said contact block 160 is fixedly mounted on the side of the apparatus frame 56. The cylinder 162 is of a single acting type so that it contracts only when actuated. The shaft 161 is kept stretched while the cylinder 162 is not actuated and is adapted to engage the contact block 160, as shown in FIG. 19, in order to place the supply unit frame 152 at a position deflected from the pallet 4.

On the other hand, a plate-like turning driver member 70 is pivotally affixed to the apparatus frame 56 via a pin, so that it is close to all the turning follower members 158 of the supply units 5B in common. The turning driver member 70 is connected to one end of the lever 73 via the link 72. The other end of the lever 73 is engaged with a pin 75 provided upright on the sliding shaft 74, slidable on the apparatus frame 56. Accordingly, the turning driver member 70 is turned with the sliding action of the sliding shaft 74. During travelling of the pallet 4, the turning driver member 70 tilts the turning follower member 158 of each supply unit 5B to the right side, as shown in FIG. 19 so as to put the supply unit 5B in a second predetermined position deflected from the pallet 4.

The cutter operating bar 80 acts on the cutter levers 149 of all the supply units 5B in common. A long pin 181 and a short pin 182 are affixed to the cutter operating bar 80, as shown in FIGS. 20 to 22, 24 and 25, and a stopper pin 183 is fixedly provided on the side of the supply unit 5B.

Figure 4:
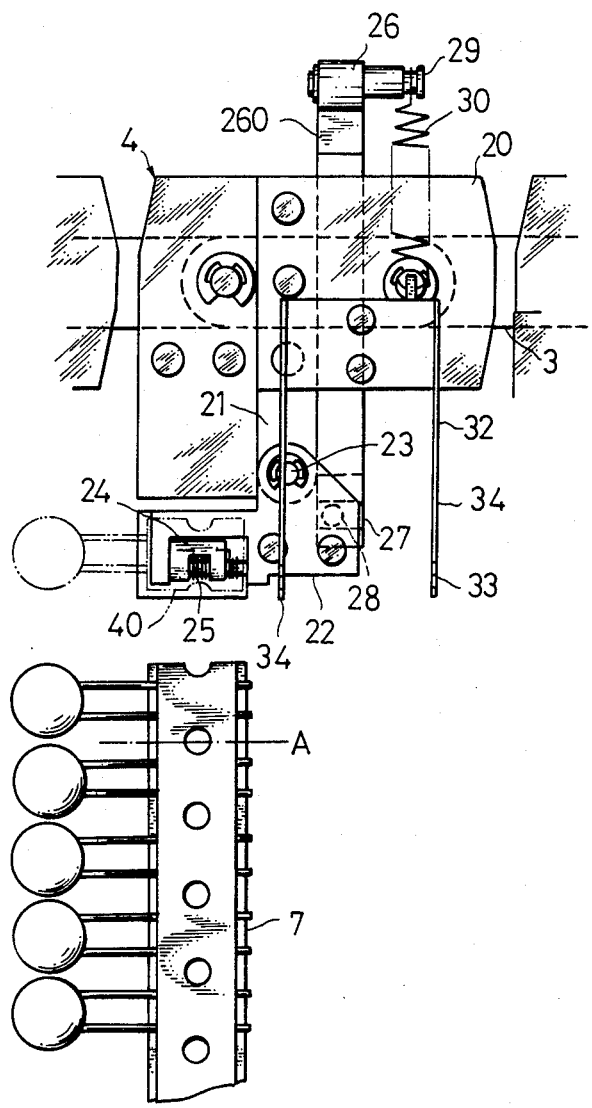
FIG. 4 is a plan view of an embodiment of the pallet of the apparatus of the invention.
Figure 6:
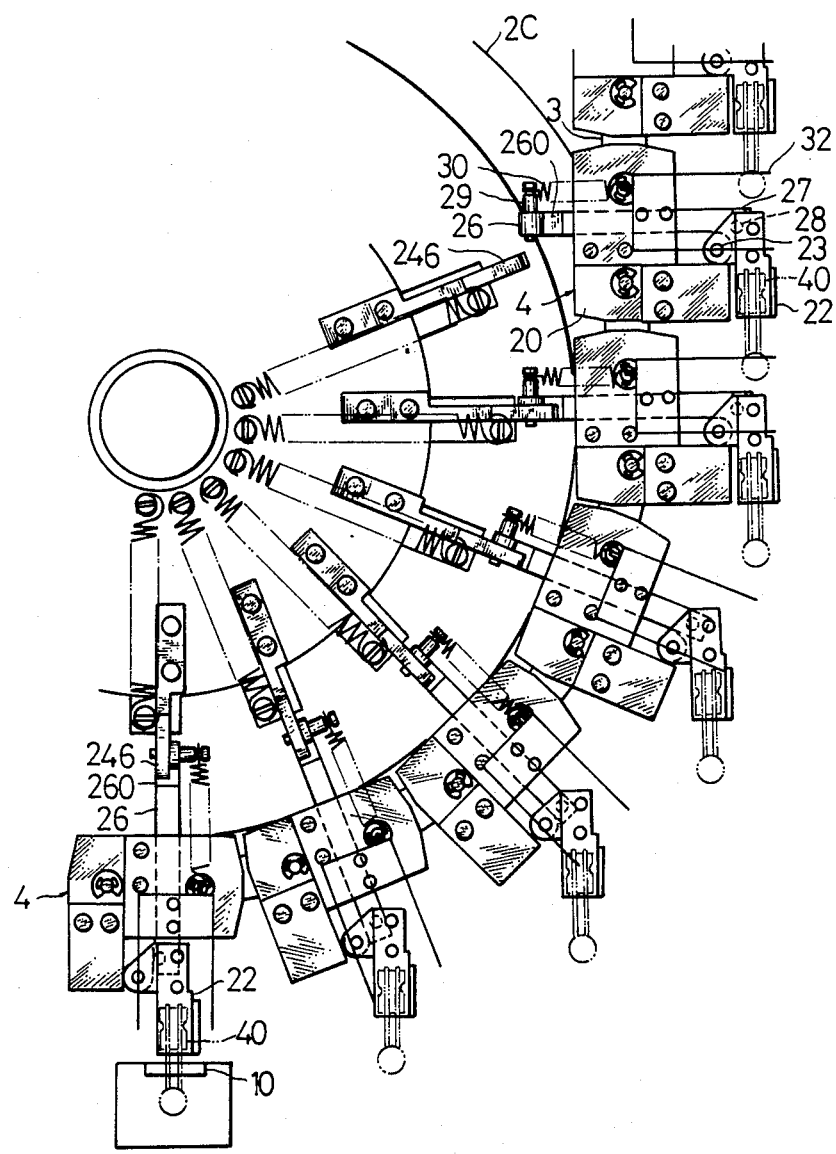
FIG. 6 is a plan view showing the action of pallets travelling around a sprocket wheel near the chuck of the apparatus of the invention.

The pallet 4 for transferring electronic components is in the state shown in FIG. 4 or FIG. 5 during normal running. However, when the pallet 4 runs curvilinearly along the sprocket wheel 2C, to which the chuck 10 is close and opposite, the component holding device 22 thereof turns, as shown in FIG. 6, in order to maintain a fixed attitude in conveying the separated piece 40 of the radial lead type electronic component web carrier to said chuck. Mechanisms for performing the aforedescribed operation are radially provided on the sprocket wheel 2C, wherein said sprocket wheel, while rotating, pulls the slide bars 26 toward the center thereof via hooks 246 in engagement with grooves 260 in the rear ends of said slide bars and rotatably drives the component holding device 22.

Figure 29:
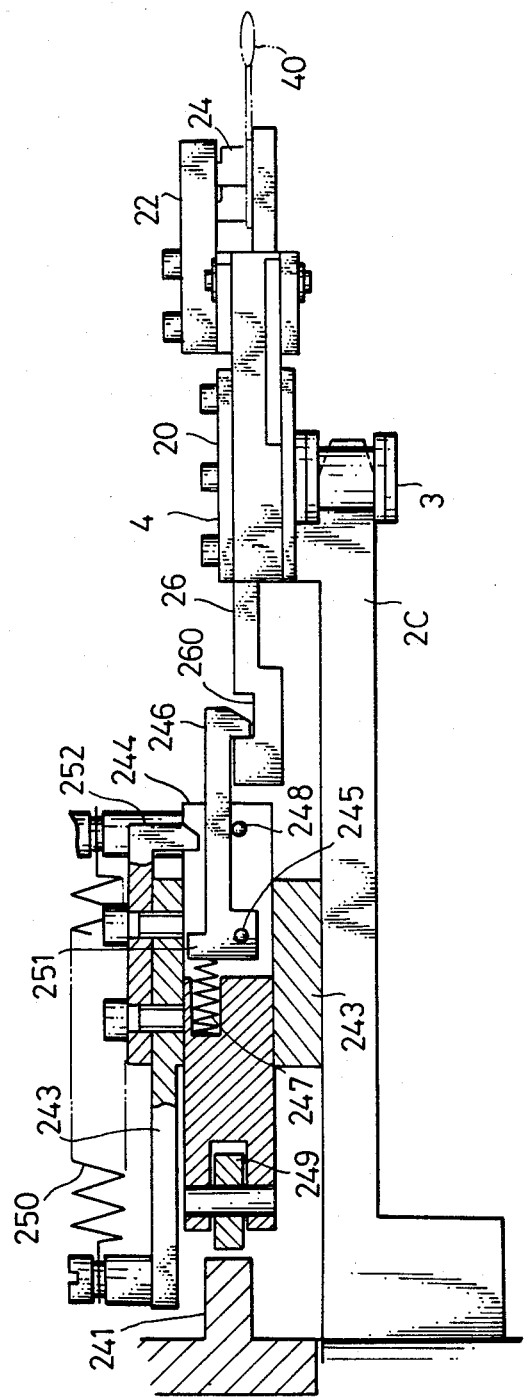
FIG. 29 is a side view, partly in section, of the embodiment of FIG. 27.

FIGS. 27 to 29 are detailed illustrations of the aforedescribed performance. In FIGS. 27 to 29, a cam 241 coaxial with the sprocket wheel 2C is fixedly supported by a cam support 242. Stationary blocks 243 are radially provided on the sprocket wheel 2C at equal angular intervals. Cam followers 244 are also provided, to slidably pass through the stationary blocks 243. A hook 246 is pivotally affixed to the front end of the cam follower 244 and is engageable with the groove 260 in the rear end of the slide bar 26. A compression spring 247 is provided between the front end of the cam follower 244 and the rear end of the hook 246. A stopper pin 248 for controlling the descending position of the hook 246 is provided for the cam follower 244. A roller 249 is provided on the rear end of the cam follower 244 and is brought into contact with the cam 241. An expansion spring 250 is provided between the cam follower 244 and the stationary block 243, and has a resiliency exceeding that of the spring 30, thereby pressing the cam follower 244 to the cam 241. An engaging device 252 is affixed to the stationary block 243 and is engageable with the rear side projection 251 of the hook 246.

Figure 7:
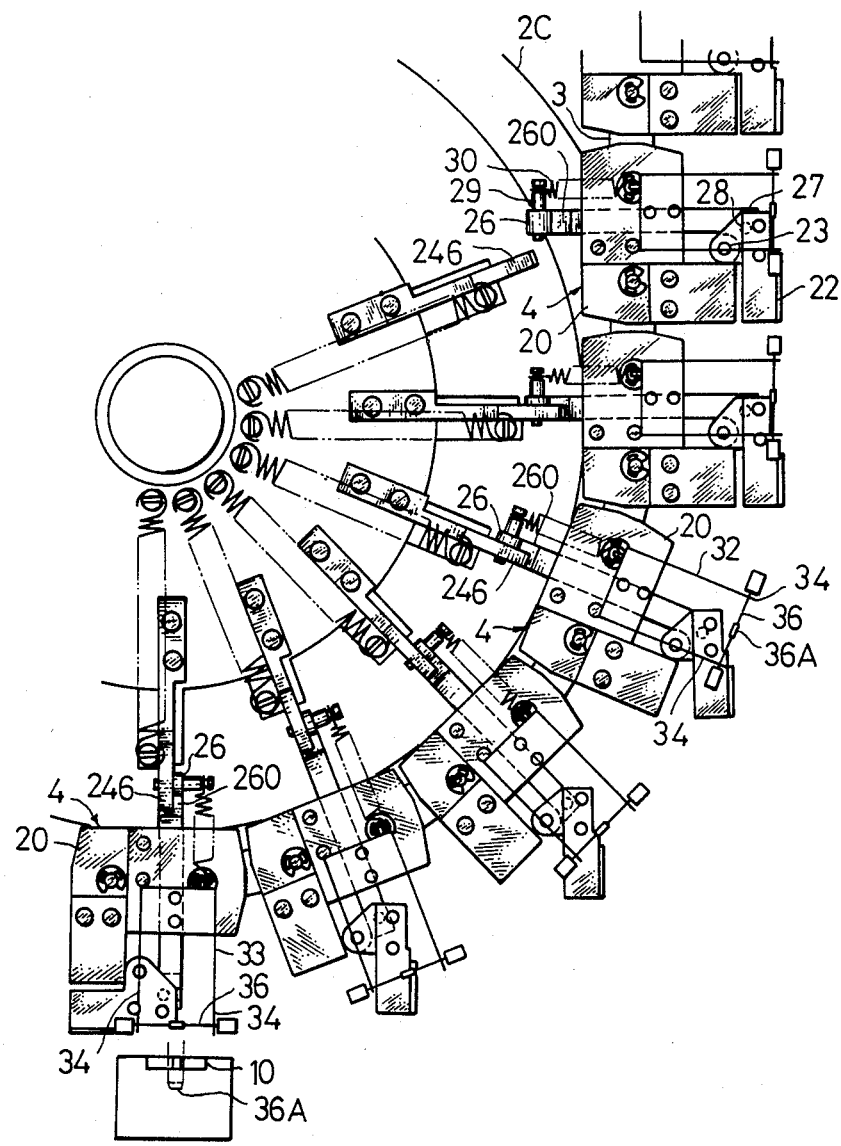
FIG. 7 is a plan view showing the action of pallets travelling around the sprocket wheel near the chuck of the apparatus of the invention.

On the other hand, while the pallet 4 is conveying the separated coaxial pieCce 36, the component holding device 22 returns to the initial state when reaching a position opposite the chuck 10, as shown in FIG. 7. FIGS. 30 to 38 show, in detail, a changeover mechanism for the aforementioned performance and a bending mechanism for bending and re-forming leads of the separated coaxial piece 36 into radial type leads and for transferring the re-formed piece to the chuck 10. In FIGS. 30 to 38, a support block 271 is fixedly mounted on the underside of a support plate 270 affixed to the apparatus frame. A horizontally moving slider 272 slidably engages the support block 271. An L-shaped roller-contacting plate 273 is affixed to the slider 272. When insertion of coaxial lead type electronic components is additionally performed, the roller-contacting plate 273 is capable of contacting a roller 275 provided on the shaft 274 extending upright on the cam follower 244. A support block 280 is affixed to the front end of the support plate 270 in order to slidably support a vertically slidable slider 281.

Figure 33:
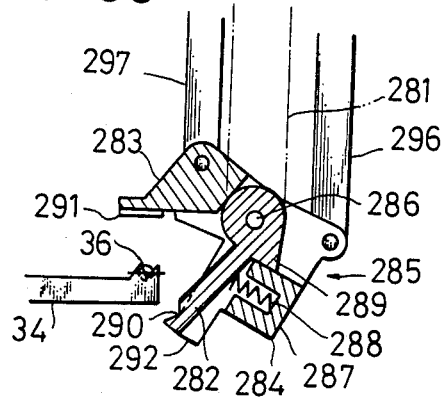
FIG. 33 is a side view, partly in section, of an embodiment of the bending mechanism of the apparatus of the invention, ready for action.

A bending mechanism 285, composed of a lower die 282, an upper die 283, and a side die 284, is pivotally affixed to the lower end of the vertically moving slider 281 via a pin 286 (FIGS. 33 to 38). As shown in FIG. 33, the lower die 282, upper die 283, and side die 284 are pivotally affixed together to the vertically moving slider 281 via the pin 286. The lower die 282 is forced upward by a compression spring 288 provided on the bottom connecting part 287 of the side die 284. The extent to which the lower die 282 is forced up is controlled by the contact of a stopper 289, formed on the lower die, with the right side of the bottom connecting part 287.

The lower die 282 is provided with a holding groove 290 for holding the main part 36A of the separated coaxial piece 36 and the upper die 283 is provided with ribs 291 on both edges for pressing root portions of the leads of the coaxial lead type electronic component. The side die 284 is provided with a pair of bent parts 292 having a distance therebetween slightly longer than the width of the upper die 283. Levers 293 and 294 are pivotally affixed together to the upper end of the vertically moving slider 281 via a pin 295. One end of the lever 293 is connected to the side die 284 via a link 296 and one end of the lever 294 is connected to the upper die via a link 297. The other end of each of the levers 293 and 294 is subjected to a driving force transmitted from the cam mechanism through the link mechanism of a changeover mechanism 310.

Figure 31:
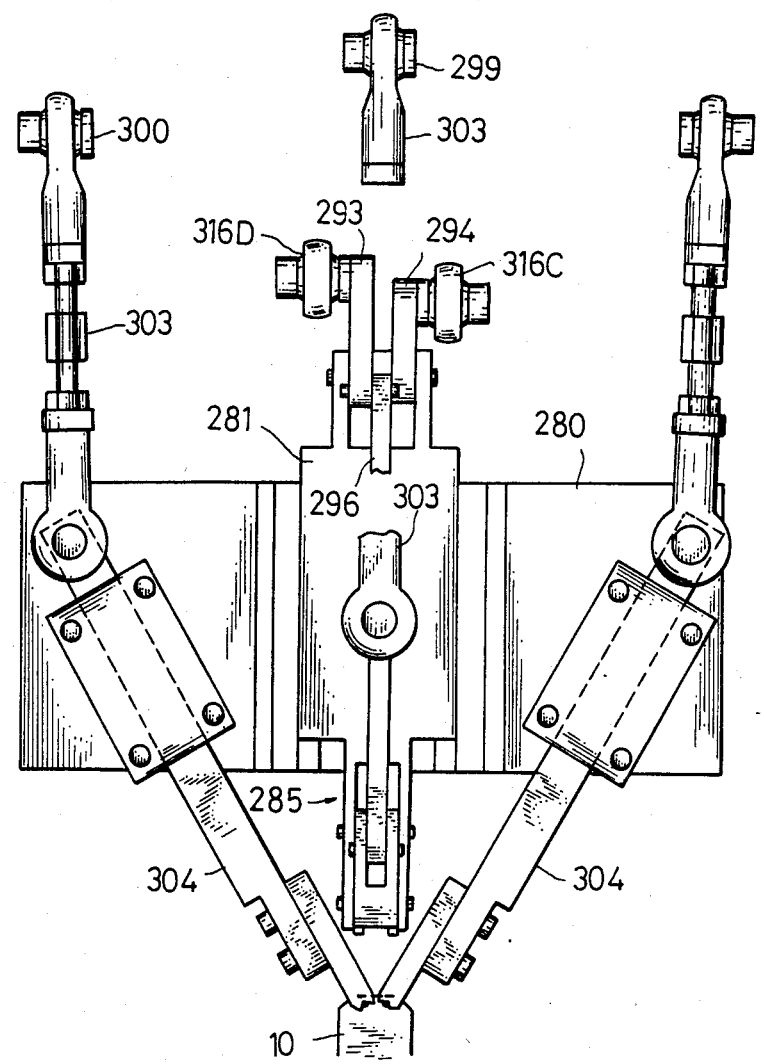
FIG. 31 is a rear view of an embodiment of the pressing member of the apparatus of the invention for a radial type lead and a peripheral structure thereof.

On the other hand, bell cranks 299 and 300 are pivotally affixed to the support plate 270 via a bracket 298 and a pin 301. One end of the bell crank 299 is connected to the vertically moving slider 281 via a link 302. As shown in FIG. 31, one end of the bell crank 300 is connected to a radial type lead pressing device 304, slidably disposed in the slant-wise direction on the support block 280, via a link 303. The radial type lead pressing device 304 presses the leads against the chuck 10 for sure gripping when the separated radial piece 40 is intended to be gripped by said chuck. The other end of each of the bell cranks 299 and 300 is subjected to a driving force transmitted from the cam mechanism via the link mechanism of the changeover mechanism 310.

Figure 32:
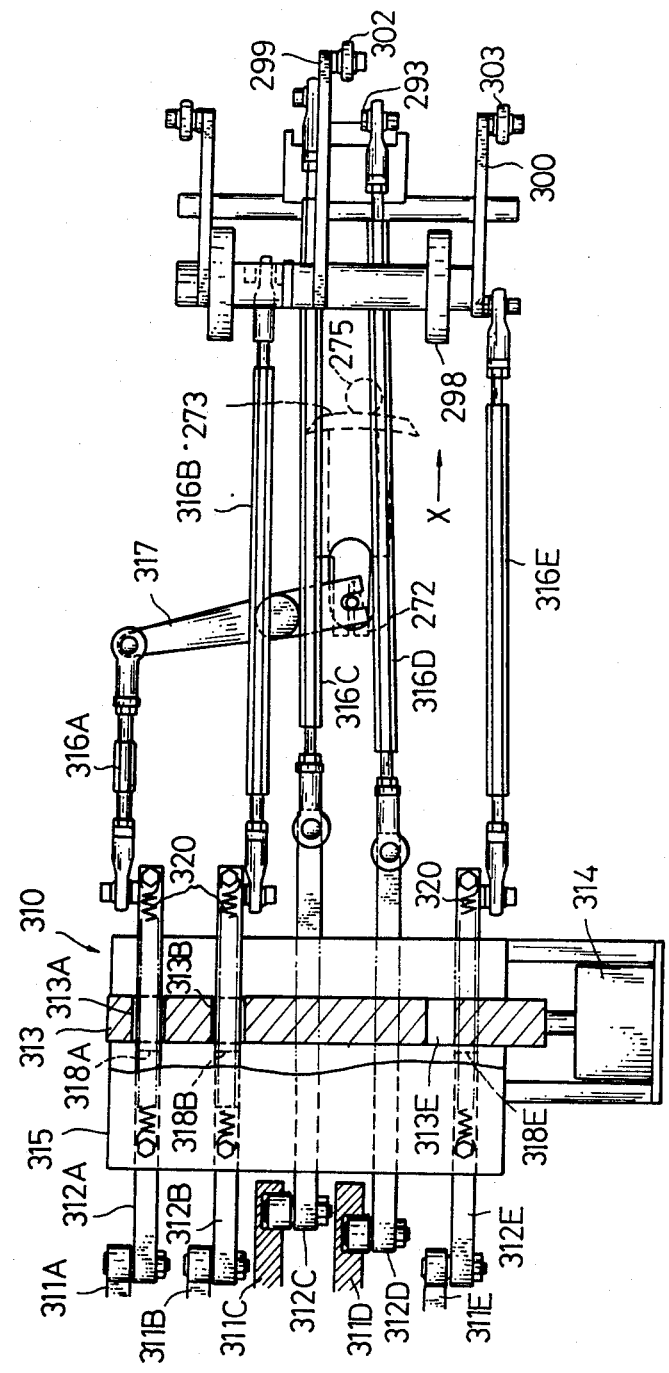
FIG. 32 is a plan view of an embodiment of the changeover mechanism of the apparatus of the invention.

As shown in FIG. 32, the changeover mechanism 310 comprises cams 311A to 311E. Each of the cam followers 312A to 312E is in contact with a respective one of the cams 311A to 311E. The changeover mechanism 310 further comprises a changeover slide bar 313 and a changeover cylinder 314. Each of the cam followers 312A to 312E is slidable with respect to support block 315 affixed to the apparatus frame. The changeover slide bar 313 is slidable with respect to the support block 315 in a direction perpendicular to the cam followers 312A to 312E. The changeover cylinder 314 is affixed to the side of the support block 315.

The cam followers 312C and 312D are driven by cams 311C and 311D, respectively, at any time, regardless of the changeover slide bar 313 and are connected to the levers 294 and 293 via links 316C and 316D, respectively. As a result, the bending mechanism 285 constantly repeats the opening and closing operation. The cam followers 312A and 312B pass through grooves 313A and 313B, respectively, of the changeover slide bar 313 and, after being released, are actuated by the cams 311A and 311B when said changeover slide bar is in the advanced position due to the expansive stroke of the changeover cylinder 314, as shown in FIG. 32, that is, when said slide bar is in operation for coaxial lead formation.

The cam follower 312A is connected to one end of a lever 317 via a link 316A. The lever 317 is pivotally supported by the support plate 270. The other end of the lever 317 is connected to the horizontally moving slider 272. Therefore, when the cam follower 312A is operated, it adapts the horizontally moving slider 272 to move forward in order to push the roller 275 on the side of pallet 4 via the roller-contact plate 273 and to return the component holding device 22 of said pallet lying opposite to the chuck 10 to the initial position, shown in FIG. 7.

Figure 30:
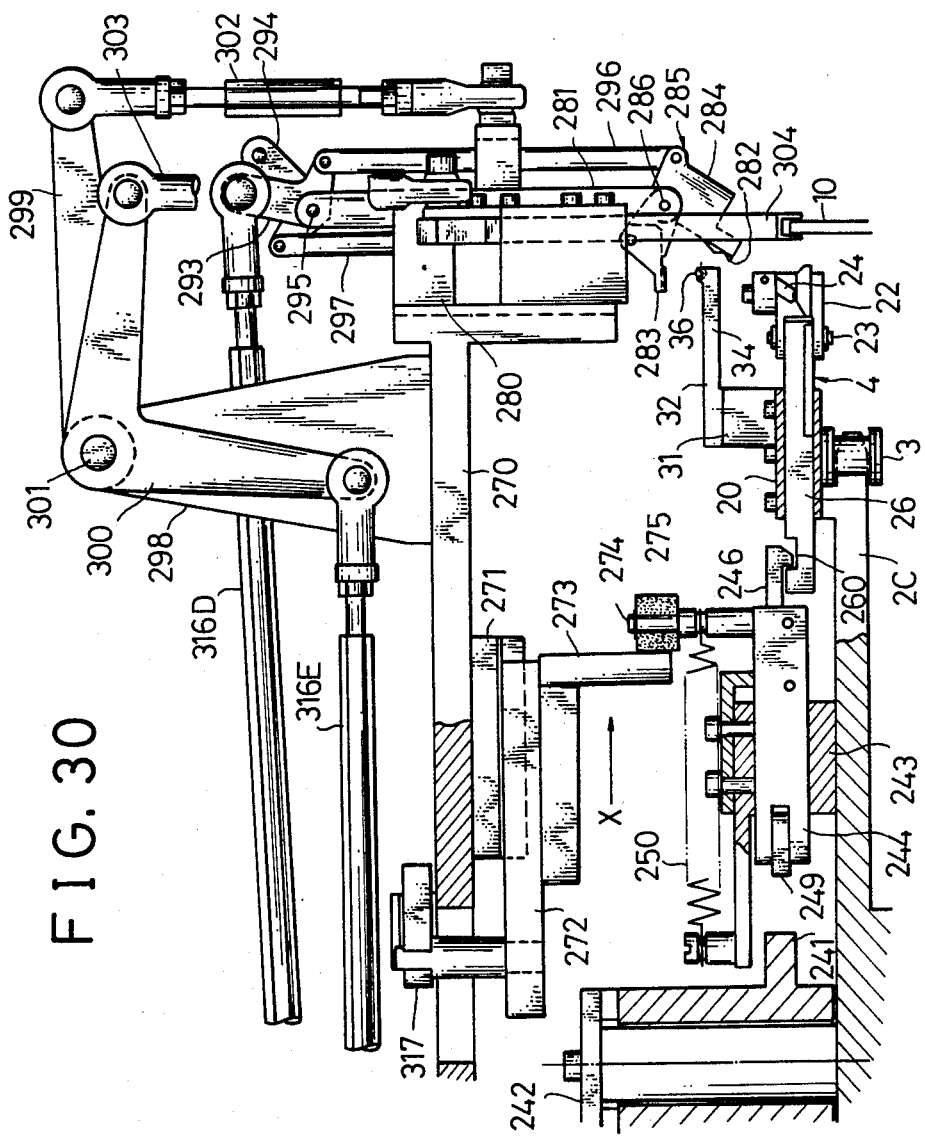
FIG. 30 is a side view, partly in section, of part of the apparatus of the invention, showing a pallet, a bending mechanism and peripheral mechanisms thereof.

The cam follower 312B is connected to one end of the bell crank 299 via a link 316B. The bell crank 299 is pivotally supported by the bracket 298 on the support plate 270. As a result, the vertically moving slider 281 is lowered via the link 316B and the bell crank 299 while the cam follower 312B operates (FIGS. 30 and 33). This enables an operation of bending the leads of the separated coaxial piece 36 by the bending mechanism 286.

The cam follower 312E, on the other hand, is out of operation, because a groove 318E thereof is locked by the changeover slide bar 313 during the coaxial lead forming operation, shown in FIG. 32. When the changeover slide bar 313 moves rearward with the contractive stroke of the cylinder 314, the cam follower 312E passes through the groove 313E of said changeover slide bar and is released or unlocked. In the aforedescribed state, that is, during the radial lead forming operation, the radial component pressing device 304 is lowered by turning the bell crank 300 connected to the cam follower 312, in order to press the leads of the separated radial piece 40 against the chuck 10.

During the radial lead forming operation, the changeover slide bar 313 engages with and locks grooves 318A and 318B of the cam followers 312A and 312B, respectively. The changeover slide bar 313 is moved when the grooves 318A, 318B and 318E of the cam followers 312A, 312B and 312E, respectively, are aligned. The cam followers 312A, 312B and 312E are energized by expansion springs 320 to contact the cams 311A, 311B and 311E, respectively.

The operation of the apparatus of the invention is described as follows. The pallets 4 for transferring electronic components move in an intermittent fashion in accordance with intermittent rotation of the sprocket wheels 2A to 2D. When the pallets 4 are in positions opposite the supply units 5, separated radial pieces 40, or separated coaxial pieces 36 obtained from the predetermined type of radial lead type electronic component web carrier or coaxial lead type electronic component web carrier, respectively, selected and cut at said supply units, are supplied to said pallets.

Figure 16:
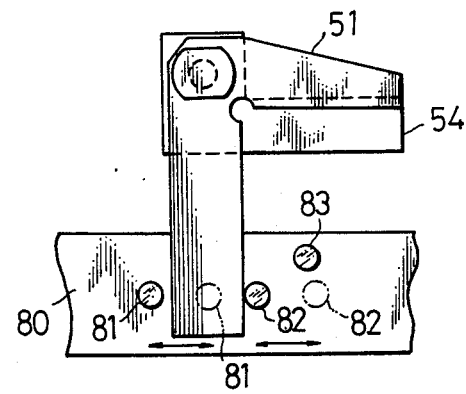
FIG. 16 is a side view of the cutter of FIG. 13.

The aforedescribed selection performance is accomplished by the actuating cylinders 62 and 162 of the selected supply units 5A and 5B, respectively. With respect to selective supply performance of the radial lead type electronic component web carrier, the turning driver member 70 is in a position turned leftward during stoppage of the pallets 4, in order to prevent interference with the movement of the turning follower member 58. Therefore, as the cylinder 62 operates and, consequently, the shaft 61 thereof withdraws, the turning follower member 58 is disengaged from the contact block 60, whereby the supply unit frame 52 approaches and faces the pallet 4, as shown in FIG. 11. In this manner, when the supply unit 5A is positioned in a first position, at which the separated radial piece 40 may be supplied to the pallet 4 by said supply unit, the cylinder 53 operates to rotate the pitch feeding wheel 50 through a specific angle for feeding the electronic component web carrier 7 by a length corresponding to the length of said separated piece thereof to the component holding device 22 of said pallet. At such time, since the lower end of the cutter 51 is interposed between and engaged with the long pin 81 and the short pin 82 in positions indicated by long and short dash lines in FIGS. 14 and 15, said long pin and said short pin are moved to the positions indicated by continuous lines with the leftward movement of the cutter operating bar 80. The cutter 51 then turns and closes, as shown in FIG. 16, whereby the electronic component web carrier 7 is cut and the separated piece 40 thereof is left behind on the component holding device 22 of the pallet 4.

With regard to the selection and supply operation for the coaxial lead type electronic component web carrier, similarly to the operation for the radial lead type electronic component web carrier, the turning driver member 70 is in a position turned left-ward in order to prevent interference with the movement of the turning follower member 58 during stoppage of the pallets 4. Therefore, since the cylinder 162 operates and consequently the shaft 161 withdraws, the turning follower member 158 is disengaged from the contact block 160, whereby the supply unit frame 152 approaches and faces the pallet 4, as shown in FIG. 18.

Figure 23:
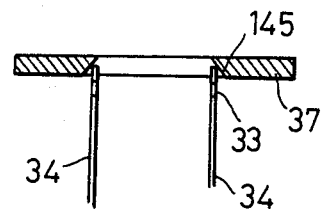
FIG. 23 is a sectional plan view showing the action of a guide of the apparatus of the invention.

In this manner, when the supply unit 5B is positioned in a first position at which the separated coaxial piece 36 may be supplied to the pallet 4 by said supply unit, the cylinder 153 operates to rotate the pitch feeding wheel 150 via the ratchet mechanism by a specific angle, which is a length equal to one pitch between the V-shaped engaging cutouts 139 in order to feed the coaxial lead type electronic component web carrier 35 by a length corresponding to the length of a separated piece 36 thereof to the component receiving jig 32 of the pallet 4. At such time, as shown in FIG. 23, the pair of resilient arms 34 of the component receiving jig 32 are correctly positioned by the tapered surfaces of the guide 37.

Figure 22:
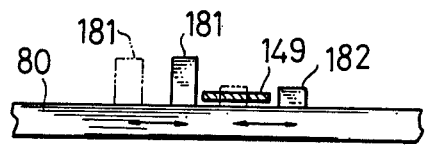
FIG. 22 is a plan view illustrating the action of the cutter of the invention.
Figure 24:
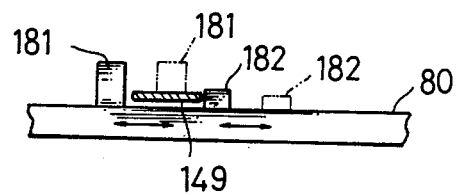
FIG. 24 is a plan view showing the action of the cutter of the apparatus of the invention.

At the same time, the lower end of the cutter lever 149 is interposed between and engaged with the long pin 181 and the short pin 182 in positions indicated by solid lines in FIG. 22. These positions are indicated, more particularly, by long and short dash lines in FIG. 20. As a result, the cutter lever 149 turns rightward with the leftward movement of the cutter operating bar 80, as shown in FIG. 24. Accordingly, the U-shaped support member 142 descends and cuts the coaxial lead type electronic component web carrier 35 between the cutter 151 and the stationary cutter blade 155. The separated piece 36 of the coaxial lead type electronic component web carrier 35 is thereby dropped onto the V-shaped engaging cutouts 33 of the component receiving jig 32 of the pallet 4 and held by said engaging cutouts in such manner that the leads of said separated piece are engaged with said cutouts.

Figure 26:
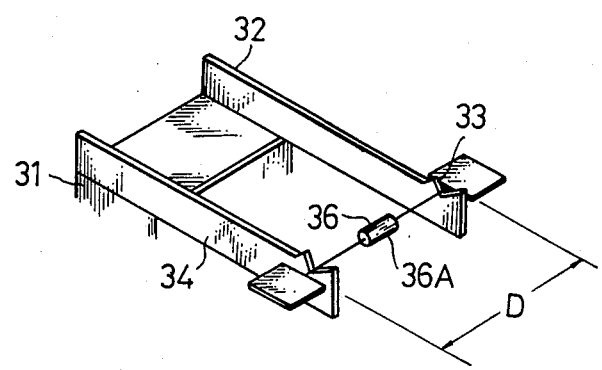
FIG. 26 is a perspective view showing the action of a jig of the apparatus of the invention for receiving the electronic component.

The distance between the pair of resilient arms 34 of the component receiving jig 32 is set slightly shorter than the distance D between the inner edges of the tapes of the separated piece 36 of the coaxial lead type electronic component web carrier 35, as shown in FIG. 26. The main part 36A of the electronic component is then positioned just between the pair of resilient arms 34.

With the operation of the supply unit 5A and 5B as hereinbefore described, a separated piece, if it is of radial type as indicated at 40, is pressed and held by the holding finger 24 against the component holding device 22 of the pallet 4, as shown in FIG. 4.

On the other hand, the separated coaxial piece 36 is transferred to the component receiving jig 32, as shown in FIG. 5, and held in such a manner that the leads of said separated coaxial piece are engaged with the lead-engaging cutouts 33.

The supplying of the electronic component web carriers is undertaken by steps in an order such that the required separated pieces are arranged on the pallets 4 in accordance with the order of inserting these pieces into the printed circuit board.

Figure 14:
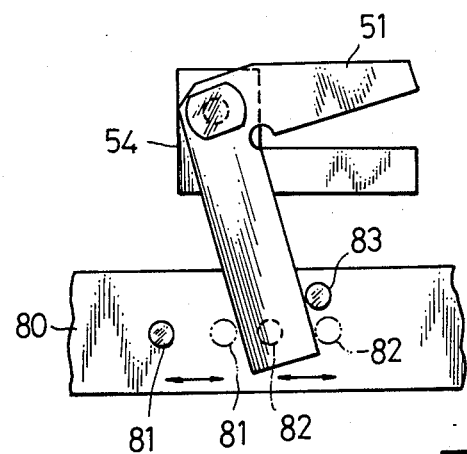
FIG. 14 is a side view of the cutter of FIG. 13.
Figure 15:
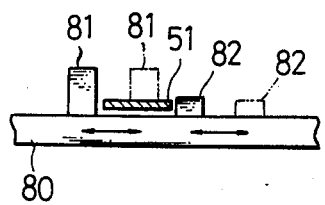
FIG. 15 is a plan view of the cutter of FIG. 13.

The remaining non-selected supply unit 5A is kept in the predetermined second position deflected from the pallet 4, as shown in FIG. 12. In such position, the shaft 61 of the cylinder 62 is maintained in engagement with the contact block 60. At such time, there is a positional relation, shown in FIG. 13, between the long pin 81, the short pin 82 and the stopper pin 83. In this relation, the cutter 51 is kept open, as shown in FIG. 14, since the short pin 82 is out of engagement with the lower end of the cutter 51, even when the cutter operating bar 80 is moved leftward.

The remaining non-selected supply unit 5B is kept in the predetermined second position deflected from the pallet 4, as shown in FIG. 19. In such position, the shaft 161 of the cylinder 162 is maintained in engagement with the contact block 160. At such time, there is a positional relation, shown in FIGS. 20 and 21, between the long pin 181, the short pin 182, and the stopper pin 183. In this relation, the cutter 151 is kept open, as shown in FIG. 20, since the short pin 182 is out of engagement with the lower end of the cutter lever 149, even when the cutter operating bar 80 is moved leftward.

The pallets 4, each holding a separated piece of electronic component web carrier, move in the direction toward the sprocket wheel 2C facing the chuck 10. During such an ordinary movement, the component holding device 22 is maintained in parallel with the pallet base 20 by the action of the expansion spring 30 of the pallet 4. Even when the pallet 4 reaches the sprocket wheel 2C, the hook 246 is out of engagement with the groove 260 of the slide bar 26 while said pallet is in an early stage of contact with said sprocket wheel, as shown in FIGS. 6 and 7. The pallet 4 is thereby kept as it was. In other words, as shown in FIG. 27, the cam follower 244 is disposed in the foremost position by the cam 241 and, as a result, the front end of the hook 246 is raised, whereas the pallet 4 is kept as it was.

When the pallet 4 begins running curvilinearly along the sprocket wheel 2C, the cam follower withdraws slightly and the front end of the hook 246 descends to engage the groove 260 at the rear end of the slide bar 26. Thereafter, with the pallet 4 running curvilinearly, the cam follower 24 withdraws and, at the same time, the slide bar 26 moves in a manner whereby it turns the component holding device 22 and maintains the separated radial piece 40 in the same attitude as before. When the pallet 4 reaches the position which the sprocket wheel 2C reaches after turning 90° upon engagement with said pallet, that is, a position just opposite to the chuck 10, the cam follower 244 withdraws to the rearmost position, as shown in FIG. 29. The displacement of the slide bar 26 as well as the turning displacement of the component holding device 22 with respect to the pallet 4 (turning by 90°) thereby reaches the maximum.

That is, when the pallet 4, positioned just opposite to the chuck 10, holds the separated radial piece 40, as shown in FIG. 6, the changeover mechanism 310 operates to form radial leads. The cam followers 312A and 312B are then locked and the roller-contacting plate 273 is in withdrawal position whereby, during turning of the pallet 4 90° along the sprocket wheel 2C, the hook 246 engages with the groove 260 of the slide bar 26. This turns the component holding device 22 holding the separated radial piece 40 to transfer said separated radial piece toward the chuck 10, while maintaining said separated radial piece in a fixed attitude.

The chuck 10 grips the leads of the separated radial piece 40 at a position reached by the sprocket wheel 2C turning 90° upon engagement thereof with the pallet 4, that is, at a position just opposite said chuck. At such time, the cam follower 312B is kept locked and the bending mechanism 285 is in a higher position to prevent it from being obstructive. The radial lead pressing device 304 is thereby lowered by the movement of the cam follower 312 via the link 316E and the bell crank 300, and presses the leads against the chuck 10 for sure gripping by said chuck. A predetermined inserting operation is performed subsequent to the gripping of the separated radial piece 40 by the chuck 10.

On the other hand, when the pallet 4 holds the separated coaxial piece 36, the changeover mechanism 310 operates to form coaxial leads when the sprocket wheel 2C turns 90° after coming into engagement with said pallet, that is, when said pallet reaches a position just opposite the chuck 10. The cam follower 312A then operates to move the roller-contacting plate 273, in the direction shown by the arrow X in FIGS. 30 and 32, via the link 316A and the lever 317. This pushes the roller 275, whereupon the hook 246 returns to the foremost position, despite the action of the expansion spring 250.

The slide bar 26 also returns to its initial position and, finally, the component holding device 22 is forcibly returned to a position in parallel with the pallet base 20, as shown in FIG. 5. The purpose of this operation is to prevent the radial lead holding device 22 from interfering with the movement of the bending mechanism 285 in bending the separated coaxial piece 36. Along with the abovesaid operation, the vertically moving slider 281 is lowered by movement of the cam follower 312B via the link 316B and the bell crank 299 to lower the bending mechanism 285 to a position shown in FIGS. 30 and 33.

Figure 34:
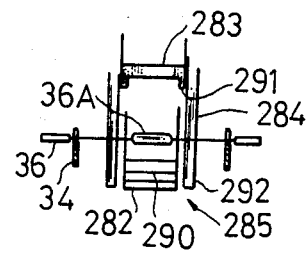
FIG. 34 is a front view of the bending mechanism of the embodiment of FIG. 33.
Figure 35:
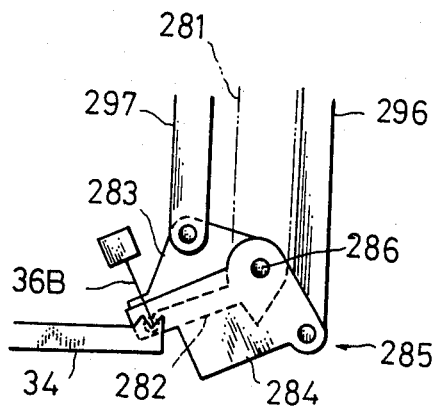
FIG. 35 is a side view of the bending mechanism of the embodiment of FIG. 33, in bending operation.
Figure 36:
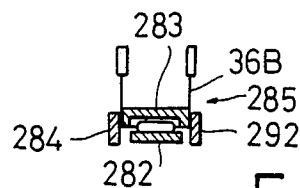
FIG. 36 is a sectional front view of the bending mechanism of the embodiment of FIG. 33.
Figure 37:
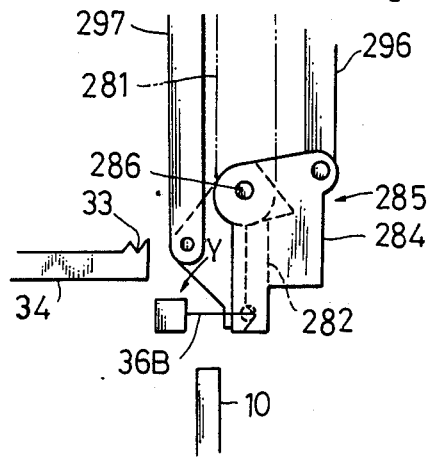
FIG. 37 is a side view of the bending mechanism of the embodiment of FIG. 33 showing the delivery action.

The lower die 282, the upper die 283 and the side die 284 of the bending mechanism 285 are kept open, as shown in FIGS. 33 and 34 to be ready to receive the component. Then, the links 296 and 297 descend with the turn of the levers 293 and 294. As a result, the separated coaxial piece 36, while held between the holding groove 290 of the lower die 282 and the upper die 283 at the main part 36A thereof, is bent by the action of the pair of bending parts 292 of the side die 284 in a manner whereby the leads of said separated coaxial piece are directed upward at a slant, as shown in FIGS. 35 and 36. The separated coaxial piece 36 is re-formed as an electronic component having radial leads. The electronic component 36B is thereby detached from the component receiving jig 32 on the side of the pallet 4 and the leads of said electronic component are kept substantially horizontal by the turn of the bending mechanism 285 in the direction shown by the arrow Y in FIG. 37.

Figure 38:
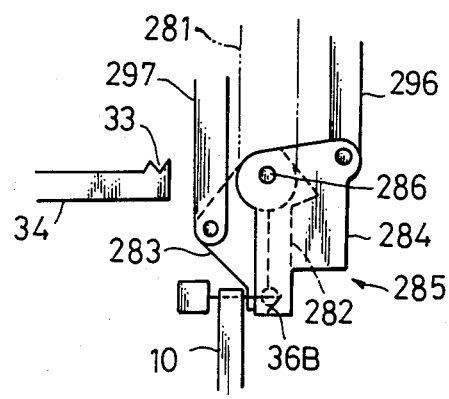
FIG. 38 is a side view of the bending mechanism of the embodiment of FIG. 33 showing the delivery action.

Thereafter, the turn of the bell crank 299, actuated by the cam follower 312B, is transmitted, via the link 302, to the vertically moving slider 281. The vertically moving slider 281 is thereby lowered. The electronic component 36B is thus transferred to the chuck 10, as shown in FIG. 38. The chuck 10 grips the electronic component 36B, re-formed as an electronic component having radial leads.

The following effects and advantages are obtained from the method and apparatus of the invention for supplying and transferring electronic components.

Separated pieces of electronic component web carrier may be transferred to the chuck by the pallets while being kept in a fixed attitude. This enables easy gripping of the separated pieces by the chuck and eliminates the need for twisting the electronic component web carrier at the time of supply thereof to the pallet. The mounting of the electronic component web carrier on the apparatus prior to driving of such apparatus is therefore easy and results in high operability of the apparatus.

Since the endless conveying mechanism comprising sprocket wheels and chain travels in a substantially horizontal plane, even when the types of electronic component web carriers vary, the height of the apparatus may be fixed within a certain range. The apparatus may thus be installed in a room having a low ceiling.

Packages each rotatably containing the reel having the electronic component web carrier wound thereon may be arranged at intervals equal to those between the pallets as well as between the supply units. The length of the electronic component web carrier to be drawn from the package may thus be a fixed constant, whereby mounting and replacement of packages is made easy.

When transferring separated pieces by the pallets, by transferably positioning the supply unit between a first position at which the separated piece may be supplied to the pallet and a second predetermined position, and by operating the cutter of the supply unit only when the supply unit is in the first position, the cutter is prevented from useless operation, caused by missing the object to be cut, and maintenance thereof is made easy, thereby enhancing the reliability of the apparatus.

The pallet is composed of a pallet base, a component receiving jig affixed to the pallet base and designed for receiving the coaxial lead type electronic component or the separated piece of coaxial lead type electronic component web carrier, and a component holding device turnable with respect to the pallet base and holding the separated radial piece. The supply of the electronic component or the separated piece of electronic component web carrier is thus easy, the electronic component is transferred in a manner which keeps the electronic component in an attitude for easy gripping by the chuck, and the conveying pallet is usable for both coaxial lead type and radial lead type electronic components.

The pallet capable of transferring the separated piece of radial lead type electronic component or coaxial lead type electronic component, the bending mechanism which re-forms a coaxial lead type electronic component into a radial lead type electronic component by bending the leads thereof and delivers the re-formed electronic component to the chuck, and the changeover mechanism for changing over an operation for forming radial lead type electronic components to another operation for forming coaxial lead type electronic components are combined in the apparatus of the invention. This enables insertion of the coaxial lead type electronic component via an automatic electronic component insertion apparatus provided with the chuck for gripping the radial lead type electronic component and thereby improves the performance of the automatic insertion apparatus and the effective utilization thereof.

In the description of the illustrated embodiment of the invention, reference is made to the component holding device 22 of the pallet 4 which holds the separated radial piece 40 having residual tapes. However, a radial lead type electronic component with its tapes removed beforehand may be held by the component holding device 22. Similarly, although the separated coaxial piece 36 is described as having residual tapes at both ends thereof and as being held by the component receiving jig 32 of the pallet 4, a coaxial lead type electronic component with its tapes removed may be supported by the component receiving jig 32.

The mechanisms for holding separated pieces of electronic web carriers on the pallets and the number or arrangement of the sprocket wheels may be appropriately varied when intended for concrete application.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a machine for processing and inserting electronic components having leads from electronic component web carriers into lead receiving openings in a printed circuit board, supply and transfer means for selectively supplying a radial lead type electronic component and a coaxial lead type electronic component at a first position and transferring said radial and coaxial lead type electronic components to a second predetermined position, said supply and transfer means comprising a plurality of pallets, each for receiving and holding one of said radial and coaxial lead type electronic components, each of said pallets including a pallet base, component holding means pivotally mounted on said pallet base for holding said radial lead type elctronic component, and component receiving means affixed to said pallet base for receiving said coaxial lead type electronic component;

endless conveying means for conveying said pallet between said first position and said second position in an intermittent fashion in a substantially horizontal plane, and having a curvilinear portion thereof;

supply means for selectively supplying the radial and and coaxial lead type electronic components to said pallets at said first position; and radial lead type electronic component attitude control means for controlling said radial lead type electronic component held by said component holding means of said pallet to be in a fixed attitude when passing over said curvilinear portion of said conveyor means.

2. A machine as claimed in claim 1, further comprising lead re-forming means provided at said second position for re-forming leads of said coaxial lead type electronic component.

3. A machine as claimed in claim 1, wherein said component receiving means has a pair of resilient arms, each having a cutout at the tip thereof for engagement with a lead.

4. A machine as claimed in claim 1, wherein said endless conveying means includes a plurality of sprocket wheels and a chain conveyor extending between said sprocket wheels, and said electronic component attitude means include a slide bar slidably mounted on said pallet base, a pin on said component holding means and engaging said slide bar, and an engaging member radially provided on one of said sprocket wheels disposed at said second position and engaging said slide bar, whereby said component holding means is turned by said engaging member adapted to slide said slide bar at a position at which said chain conveyor begins running curvilinearly, to control said radial lead type electronic component to be in a fixed attitude.

5. A machine as claimed in claim 2, wherein said lead re-forming means comprises a vertically moving slider having a lower end, a lower die pivotally secured to said lower end of said slider, an upper die pivotally secured to said lower end of said slider, and a side die pivotally secured to said lower end of said slider, whereby the body of the coaxial lead type electronic component at said second position is gripped by said lower die and said upper die and leads of said coaxial lead type electronic component are re-formed by said side die.

6. A machine as claimed in claim 4, wherein said engaging member comprises a cam disposed coaxially with said sprocket wheel, a cam follower moved by said cam, said cam follower having a front end, and a hook pivotally affixed to the front end of said cam follower and engaged with said slide bar.

7. In a machine for processing and inserting electronic components having leads from electronic component web carriers into lead receiving openings in a printed circuit board, supplying and transfer means for selectively supplying a radial lead type electronic component and a coaxial lead type electronic component at a first position and transferring said radial lead type and coaxial lead type electronic components to a second predetermined position, said supply and transfer means comprising a plurality of pallets, each for receiving and holding one of said radial lead type and coaxial lead type electronic components, each of said pallets including a pallet base, component holding means pivotally mounted on said pallet base for holding said radial lead type component, and component receiving means affixed to said pallet base for receiving said coaxial lead type electronic component;
endless conveying means for conveying said pallets in an intermittent fashion in a substantially horizontal plane, and having a curvilinear portion thereof;
supply means for selectively supplying said radial and coaxial lead type electronic components to said pallets at said first position;
electronic component attitude control means provided at said second position for controlling the attitude of the radial lead type electronic component held by said pallet when passing over the curvilinear portion of said conveyor means at said second position;
lead re-forming means for re-forming leads of said coaxial lead type electronic component at said second position; and
actuating means for selectively actuating said lead re-forming means.

8. In a machine for processing and inserting electronic components having leads from electronic component web carriers into lead receiving openings in a printed circuit board, supply and transfer means for selectively supplying radial lead type electronic components and coaxial lead type electronic components at a first position and transferring said radial lead type electronic components and coaxial lead type electronic components to a second predetermined position, said supply and transfer means comprising a plurality of pallets, each for receiving and holding one of said radial lead type and coaxial lead type electronic components, each of said pallets including a pallet base, component holding means pivotally mounted on said pallet base for gripping a radial lead type electronic componet, and a component receiving jig affixed to said pallet base for receiving a coaxial lead type electronic component;
endless conveying means for conveying said pallets between said first position and said second position in an intermittent fashion in a substantially horizontal plane, and having a curvilinear portion thereof;
supply means for selectively supplying said radial lead type electronic components and coaxial lead type electronic components to said pallets at said first position; and
radial lead type electronic component attitude control means at said second position for controlling said radial lead type electronic component gripped by said component holding means of said pallet to be in a fixed attitude when passing over said curvilinear portion of said conveyor means.

9. A machine as claimed in claim 8, wherein said supply means includes a plurality of supply units arranged in a row at said first position, said supply units including a first group of supply units for selectively supplying said radial lead type electronic components to said pallets and a second group of supply units for selectively supplying said coaxial lead type electronic components to said pallets.

10. A machine as claimed in claim 8, further comprising lead re-forming means at said second position for re-forming a coaxial lead of said coaxial lead type electronic component into a radial type lead.

11. A machine as claimed in claim 8, wherein said endless conveying means includes a plurality of sprocket wheels and a chain conveyor extending between said sprocket wheels, said radial lead type electronic component attitude control means includes a slide bar slidably mounted on said pallet base, a pin on said component holding means and engaging said slide bar, and an engaging member radially provided on one of said sprocket wheels positioned at said second position and engaging said slide bar, whereby said component holding means is turned by said engaging member adapted to slide said slide bar at a position at which said chain conveyor begins running curvilinearly, to control said radial lead type electronic component to be in a fixed attitude.

12. A machine as claimed in claim 10, wherein said lead re-forming means includes a vertically moving slider having a lower end, a lower die pivotally affixed to the lower end of said slider, an upper die pivotally affixed to the lower end of said slider, and a side die pivotally affixed to the lower end of said slider, whereby the body of a coaxial lead type electronic component at said second position is gripped by said lower die and said upper die, and leads of said coaxial lead type electronic component are re-formed into radial type leads by said side die.

13. In a machine for processing and inserting electronic components having leads from electronic component web carriers into lead receiving openings in a printed circuit board, supply and transfer means for selectively supplying radial lead type electronic components and coaxial lead type electronic components at a first position and transferring said radial lead type electronic components and coaxial lead type electronic components to a second predetermined position, said supply and transfer means comprising a plurality of pallets, each for receiving and holding one of said radial lead type and coaxial lead type electronic components, each of said pallets including a pallet base, component holding means pivotally mounted on said pallet base for holding said radial lead type electronic component, and component receiving means affixed to said pallet base for receiving said coaxial lead type electronic component;

endless conveying means for conveying said pallets between said first position and said second position in an intermittent fashion in a substantially horizontal plane, and having a curvilinear portion thereof;

supply means for selectively supplying said radial lead type electronic components and coaxial lead type electronic components to said pallets at said first position;

radial lead type electronic component attitude control means at said second position for controlling said radial lead type electronic component to be in a fixed attitude when passing over said curvilinear portion of said conveyor means;

lead re-forming means at said second position for re-forming a coaxial lead of said coaxial lead type electronic component into a radial type lead; and actuating means for selectively actuating said lead re-forming means when said pallet positioned at said second position holds said coaxial lead type electronic component.

14. A method of supplying and transferring electronic components, said method comprising the steps of selectively supplying an electronic component web carrier composed of radial lead type electronic components or coaxial lead type electronic components arranged in a row;

cutting said electronic component web carrier to form separated pieces each having one radial lead type electronic component or one coaxial lead type electronic component;

mounting the separated pieces on pallets at a first position, whereby any radial lead type electronic component is pivotally mounted upon a base of a pallet;

transferring each pallet on which a separated piece is mounted to a second predetermined position in an intermittent fashion in a substantially horizontal plane, and along a path, a portion of which is curvilinear;

maintaining any radial lead type electronic component in a fixed attitude when passing over the curvilinear portion of the transferring path;

picking up said separated piece on said pallet at said second position;

re-forming the coaxial lead of any coaxial lead type electronic component contained in said picked-up separated piece into radial leads at said second position; and delivering said separated piece having re-formed leads, while holding the re-formed leads thereof, to an inserting assembly at said second position.

15. A method of supplying and transferring electronic components, said method comprising the steps of supplying an electronic component web carrier composed of radial lead type electronic components arranged in a row and an electronic component web carrier composed of coaxial lead type electronic components arranged in a row;

cutting said electronic component web carriers to form a first group of separated pieces each having one radial lead type electronic component and a second group of separated pieces each having one coaxial lead type electronic component;

mounting the separated pieces one by one on different pallets at a first position, whereby the radial lead type electronic component is pivotally mounted upon a base of a pallet;

transferring each pallet on which a separated piece is mounted to a second predetermined position in an intermittent fashion in a substantially horizontal plane, and along a path, a portion of which is curvilinear;

maintaining a radial lead type electronic component in a fixed attitude when passing over the curvilinear portion of the path;

delivering said separated piece, when the pallet conveyed to said second position holds said separated piece having a radial leas type electronic component, from said pallet to an inserting assembly directly at said second position, while holding the leads of said component;

picking up said separated piece, when the pallet conveyed to said second position holds said separated piece having a coaxial lead type electronic component, from said pallet;

re-forming the coaxial leads of said coaxial lead type electronic component contained in said picked-up separated piece into radial type leads at said second position; and delivering said separated piece having re-formed leads, while holding the re-formed leads thereof, to an inserting assembly at said second position.

* * * * *